(12) United States Patent
Fan et al.

(10) Patent No.: US 12,646,467 B2
(45) Date of Patent: *Jun. 2, 2026

(54) DISPLAY SUBSTRATE, DISPLAY PANEL AND DISPLAY DEVICE

(71) Applicants:Chengdu BOE Optoelectronics Technology Co., Ltd., Chengdu (CN); BOE TECHNOLOGY GROUP CO., LTD., Beijing (CN)

(72) Inventors: Cong Fan, Beijing (CN); Xiangdan Dong, Beijing (CN); Kemeng Tong, Beijing (CN); Hongwei Ma, Beijing (CN); Rong Wang, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/057,760

(22) Filed: Feb. 19, 2025

(65) Prior Publication Data

US 2025/0191542 A1     Jun. 12, 2025

Related U.S. Application Data

(63) Continuation of application No. 18/032,378, filed as application No. PCT/CN2022/095607 on May 27, 2022, now Pat. No. 12,300,180.

(51) Int. Cl.
G09G 3/3266 (2016.01)
G09G 3/32 (2016.01)
G11C 19/28 (2006.01)

(52) U.S. Cl.
CPC ............. *G09G 3/3266* (2013.01); *G09G 3/32* (2013.01); *G09G 2300/0426* (2013.01);
(Continued)

(58) Field of Classification Search
CPC .................. G09G 3/3266; G09G 3/32; G09G 2300/0426; G09G 2310/0232;
(Continued)

(56) References Cited

U.S. PATENT DOCUMENTS

| | | | |
|---|---|---|---|
| 2022/0052133 A1* | 2/2022 | Yang .................... | H10K 50/844 |
| 2024/0138220 A1* | 4/2024 | Ma ........................ | H10K 59/131 |
| 2024/0321188 A1* | 9/2024 | Dai .......................... | G09G 3/32 |

* cited by examiner

*Primary Examiner* — Dennis P Joseph
(74) *Attorney, Agent, or Firm* — HOUTTEMAN LAW LLC

(57) ABSTRACT

A display substrate includes: a base substrate; light-emitting elements located in a display area; pixel driving circuits located respectively connected to the light-emitting elements, each pixel driving circuit including an N-type transistor and a P-type transistor; a first gate driving circuit, a second gate driving circuit and a third gate driving circuit in a border area of the display area, the first and third gate driving circuits being connected with the P-type transistor, the second gate driving circuit being connected with the N-type transistor, and orthographic projections of the first to third gate driving circuits on the base substrate are not overlapped with each other; and a planarization layer located between the pixel driving circuits and the light-emitting elements.

20 Claims, 20 Drawing Sheets

(52) U.S. Cl.
CPC .............. *G09G 2300/0842* (2013.01); *G09G 2310/0232* (2013.01); *G09G 2310/0267* (2013.01); *G09G 2310/0286* (2013.01); *G11C 19/287* (2013.01)

(58) Field of Classification Search
CPC ... G09G 2310/0267; G09G 2310/0286; G11C 19/287
See application file for complete search history.

B-B′

C–C′

DISPLAY SUBSTRATE, DISPLAY PANEL AND DISPLAY DEVICE

TECHNICAL FIELD

The present disclosure relates to the field of display technology, and particularly relates to a display substrate, a display panel and a display device.

BACKGROUND

For a Low Temperature Polysilicon Oxide (LTPO) display product in the related art, materials, which generally are low-temperature polycrystalline silicon, of channels of part of transistors (such as a threshold compensation transistor and a reset transistor connected to a gate of a driving transistor) in a low temperature polycrystalline silicon (LTPS) pixel circuit are mainly replaced with metal oxide materials, so that the LTPS transistors in the pixel circuit are used for driving a screen to display, and the metal oxide transistors are used as switching transistors. Such new process combines the advantages of strong driving capability of the LTPS transistor, low leakage current and low power consumption of the metal oxide transistor and the like, thereby greatly reducing the power consumption of the display product and realizing the advantages such as high dynamic performance and low refresh rate.

SUMMARY

Embodiments of the present disclosure provide a display substrate, a display panel and a display device.

In a first aspect, an embodiment of the present disclosure provides a display substrate, including:

a base substrate;

a plurality of light-emitting elements located in a display area;

a plurality of pixel driving circuits located on the base substrate, where the light-emitting elements are located on a side of the pixel driving circuits away from the base substrate, the pixel driving circuits are respectively connected with the light-emitting elements correspondingly, and each pixel driving circuit includes an N-type transistor and a P-type transistor;

a first gate driving circuit, a second gate driving circuit and a third gate driving circuit located on the base substrate and at least arranged in a border area at a periphery of the display area, where the first gate driving circuit and the third gate driving circuit are connected to the P-type transistor in each pixel driving circuit, the second gate driving circuit is connected with the N-type transistor in each pixel driving circuit; the third gate driving circuit, the second gate driving circuit and the first gate driving circuit are sequentially arranged along a direction away from the display area, and orthographic projections of the third gate driving circuit, the second gate driving circuit and the first gate driving circuit on the base substrate are not overlapped with each other; and where orthographic projections of adjacent boundary areas of the first gate driving circuit and the second gate driving circuit on the base substrate are at least partially nested; and a planarization layer located between the pixel driving circuits and the light-emitting elements and extending to be of an entire surface structure to cover the first gate driving circuit, the second gate driving circuit and the third gate driving circuit.

In some implementations, adjacent boundary areas of the orthographic projections of the second gate driving circuit and the third gate driving circuit on the base substrate are at least partially nested.

In some implementations, a part of a boundary area of the first gate driving circuit adjacent to the second gate driving circuit is formed with a first notch portion; a part of a boundary area of the second gate driving circuit, which is close to the first gate driving circuit, extends to a region where the first gate driving circuit is located to form a first protruding portion;

the first protruding portion is correspondingly located in the first notch portion, and a shape of an orthographic projection of the first protruding portion on the base substrate is matched with a shape of an orthographic projection of the first notch portion on the base substrate;

and/or, a part of a boundary area of the second gate driving circuit, which is close to the first gate driving circuit, is formed with a second notch portion; a part of a boundary area of the first gate driving circuit, which is close to the second gate driving circuit, extends to a region where the second gate driving circuit is located to form a second protruding portion;

the second protruding portion is correspondingly located in the second notch portion, and a shape of an orthographic projection of the second protruding portion on the base substrate is matched with a shape of an orthographic projection of the second notch portion on the base substrate.

In some implementations, in adjacent boundary areas of the first gate driving circuit and the second gate driving circuit, part of wirings of the first gate driving circuit extend to the region where the second gate driving circuit is located;

and/or, part of wirings of the second gate driving circuit extend to the region where the first gate driving circuit is located.

In some implementations, a boundary area of the second gate driving circuit close to the third gate driving circuit is partially formed with a third notch portion; a part of a boundary area of the third gate driving circuit, which is close to the second gate driving circuit, extends to the region where the second gate driving circuit is located to form a third protruding portion;

the third protruding portion is correspondingly located in the third notch portion, and a shape of an orthographic projection of the third protruding portion on the base substrate is matched with a shape of an orthographic projection of the third notch portion on the base substrate;

and/or, a part of a boundary area of the third gate driving circuit close to the second gate driving circuit is formed with a fourth notch portion; a part of a boundary area of the second gate driving circuit, which is close to the third gate driving circuit, extends to a region where the third gate driving circuit is located to form a fourth protruding portion;

the fourth protruding portion is correspondingly located in the fourth notch portion, and a shape of an orthographic projection of the fourth protruding portion on the base substrate is matched with a shape of an orthographic projection of the fourth notch portion on the base substrate.

In some implementations, in adjacent boundary areas of the second gate driving circuit and the third gate driving circuit, part of wirings of the second gate driving circuit extend to the region where the third gate driving circuit is located;

and/or, part of wirings of the third gate driving circuit extend to the region where the second gate driving circuit is located.

In some implementations, the display substrate further includes: a first semiconductor layer and a first conductive layer sequentially stacked on the base substrate, and a gate insulating layer is arranged between the first semiconductor layer and the first conductive layer, where the first gate driving circuit, the second gate driving circuit and the third gate driving circuit each include a plurality of transistors and a plurality of capacitors;

the first semiconductor layer includes patterns of active layers of the transistors;

the first conductive layer includes patterns of gates of the transistors, first connection lines connected with the gates, first plates of the capacitors and second connection lines connected with the first plates;

the patterns of part of the active layers in the first semiconductor layer are located in the first protruding portion;

the patterns of part of the gates and part of the first connection lines in the first conductive layer are located in the first protruding portion.

In some implementations, the display substrate further includes a second conductive layer located on a side of the first conductive layer away from the base substrate, and a first passivation layer is arranged between the second conductive layer and the first conductive layer;

the second conductive layer includes patterns of second plates of the capacitors and third connection lines;

the patterns of part of the third connection lines in the second conductive layer are located in the first protruding portion.

In some implementations, the second conductive layer further includes patterns of fourth connection lines; and part of the fourth connection lines extends from the region where the first gate driving circuit is located to the region where the second gate driving circuit is located.

In some implementations, part of the fourth connection lines further extends from the region where the second gate driving circuit is located to the region where the third gate driving circuit is located.

In some implementations, the display substrate further includes a third conductive layer on a side of the second conductive layer away from the base substrate, where a second passivation layer is arranged between the third conductive layer and the second conductive layer;

the third conductive layer includes patterns of fifth connection lines; and part of the fifth connection lines extends from the region where the second gate driving circuit is located to the region where the third gate driving circuit is located.

In some implementations, the display substrate further includes a fourth conductive layer locate on a side of the third conductive layer away from the base substrate, where a first intermediate dielectric layer and a second intermediate dielectric layer are arranged between the fourth conductive layer and the third conductive layer, and the first intermediate dielectric layer and the second intermediate dielectric layer are stacked sequentially in a direction away from the third conductive layer;

first layer via holes are formed in the first intermediate dielectric layer and configured to connect conductive patterns in the fourth conductive layer with conductive patterns in the third conductive layer;

second layer via holes are formed in the second intermediate dielectric layer and are configured to connect the conductive patterns in the fourth conductive layer with conductive patterns in the first conductive layer and conductive patterns in the second conductive layer, respectively;

the fourth conductive layer includes patterns of sources and drains of the transistors and sixth connection lines;

the sixth connection lines are configured to be connected to the sources, the drains and the gates;

the patterns of part of the sources, part of the drains and part of the sixth connection lines in the fourth conductive layer are located in the first protruding portion.

In some implementations, the fourth conductive layer further includes patterns of seventh connection lines;

part of the seventh connection lines extend from the region where the first gate driving circuit is located to the region where the second gate driving circuit is located; and part of the seventh connection lines extend from the region where the second gate driving circuit is located to the region where the third gate driving circuit is located.

In some implementations, the fourth conductive layer further includes patterns of eighth connection lines, and part of the eighth connection lines extend from the region where the second gate driving circuit is located to the region where the third gate driving circuit is located.

In some implementations, the display substrate further includes:

a first group of signal lines connected to the first gate driving circuit;

a second group of signal lines connected to the second gate driving circuit;

a third group of signal lines connected to the third gate driving circuit, where orthographic projections of the first group of signal lines on the base substrate are overlapped with the orthographic projection of the first gate driving circuit on the base substrate;

orthographic projections of the second group of signal lines on the base substrate are overlapped with the orthographic projection of the second gate driving circuit on the base substrate; and orthographic projections of the third group of signal lines on the base substrate are overlapped with the orthographic projection of the third gate driving circuit on the base substrate.

In some implementations, the first group of signal lines, the second group of signal lines, and the third group of signal lines each include a power signal line, a clock signal line, and a trigger signal line, the power signal line includes a first power signal line and a second power signal line, clock signal lines in the first group of signal lines and the second group of signal lines each include a first clock signal line, a second clock signal line, and a third clock signal line;

the fourth conductive layer further includes patterns of the second power signal line in the first group of signal lines and the second clock signal line in the second group of signal lines.

In some implementations, the display substrate further includes a fifth conductive layer located on a side of the fourth conductive layer away from the base substrate;

the planarization layer includes a first sub-layer located between the fourth conductive layer and the fifth conductive layer;

the fifth conductive layer further includes patterns of signal lines of the first group of signal lines, the second group of signal lines, and the third group of signal lines except the second power signal line of the first group of signal lines and the second clock signal line of the second group of signal lines.

In some implementations, each pixel driving circuit is connected with a first reset power line and a second reset power line;

the fifth conductive layer further includes patterns of the first reset power line and the second reset power line;

orthographic projections of the first reset power line and the second reset power line on the base substrate are overlapped with the orthographic projection of the third gate driving circuit on the base substrate;

the orthographic projection of the first reset power line on the base substrate covers the capacitors in the third gate driving circuit.

In some implementations, the display substrate further includes a sixth conductive layer located on a side of the fifth conductive layer away from the base substrate;

the planarization layer further includes a second sub-layer located between the fifth conductive layer and the sixth conductive layer;

the sixth conductive layer includes patterns of the first group of signal lines, the second group of signal lines, the third group of signal lines, the first reset power line, and the second reset power line;

an orthographic projection of each signal line in the sixth conductive layer is overlapped with orthographic projections of a signal line, which is the same as the signal in the sixth conductive layer, in the fifth conductive layer and the fourth conductive layer on the base substrate, and each signal line in the sixth conductive layer is connected with a signal line, which is the same as the signal in the sixth conductive layer, in the fifth conductive layer and the fourth conductive layer through via holes formed in the second sub-layer.

In some implementations, the display substrate further includes:

a first group of signal lines connected to the first gate driving circuit;

a second group of signal lines connected to the second gate driving circuit;

a third group of signal lines connected to the third gate driving circuit, where the first group of signal lines are arranged on a side, away from the display area, of the first gate driving circuit;

the second group of signal lines and the third group of signal lines are arranged on a side, proximal to the display area, of the third gate driving circuit, and orthographic projections of the third group of signal lines and the second group of signal lines on the base substrate are not overlapped with each other.

In some implementations, the display substrate further includes:

a first group of signal lines connected to the first gate driving circuit;

a second group of signal lines connected to the second gate driving circuit;

the first group of signal lines are arranged on a side, away from the display area, of the first gate driving circuit;

the second group of signal lines are arranged in a region between the second gate driving circuit and the third gate driving circuit.

In some implementations, the display substrate further includes: a third group of signal lines connected to the third gate driving circuit, where the third group of signal lines are arranged in a region between the second gate driving circuit and the third gate driving circuit, and orthographic projections of the third group of signal lines and the second group of signal lines on the base substrate are not overlapped with each other;

or, the third group of signal lines are arranged on a side, close to the display area, of the third gate driving circuit.

In some implementations, the pixel driving circuit includes: a first reset sub-circuit, a threshold compensation sub-circuit, a driving sub-circuit, a data writing sub-circuit, a first light-emitting control sub-circuit, a second light-emitting control sub-circuit, a second reset sub-circuit and a storage sub-circuit;

the first reset sub-circuit is respectively connected with a control terminal of the driving sub-circuit and the second gate driving circuit, and is configured to reset the control terminal of the driving sub-circuit under the control of a first reset signal and a scanning signal output by the second gate driving circuit;

the threshold compensation sub-circuit is respectively connected with the control terminal and a second terminal of the driving sub-circuit and the second gate driving circuit, and is configured to compensate a threshold of the driving sub-circuit under the control of the scanning signal output by the second gate driving circuit;

the data writing sub-circuit is respectively connected with a first terminal of the driving sub-circuit and the third gate driving circuit, and is configured to write a data signal into the storage sub-circuit under the control of a scanning signal output by the third gate driving circuit;

the storage sub-circuit is electrically connected with the control terminal of the driving sub-circuit and a first power voltage line, respectively, and is configured to store the data signal;

the first light-emitting control sub-circuit is respectively connected with the first power voltage line, the first terminal of the driving sub-circuit and the first gate driving circuit, and is configured to realize connection or disconnection between the driving sub-circuit and the first power voltage line under the control of a light-emitting control signal output by the first gate driving circuit;

the second light-emitting control sub-circuit is respectively connected with the second terminal of the driving sub-circuit, a first electrode of a light-emitting element and the first gate driving circuit, and is configured to realize connection or disconnection between the driving sub-circuit and the light-emitting element under the control of the light-emitting control signal output by the first gate driving circuit;

the second reset sub-circuit is respectively connected with the first electrode of the light-emitting element and the third gate driving circuit, and is configured to reset the control terminal of the driving sub-circuit and the first electrode of the light-emitting element under the control of a second reset signal and the scanning signal output by the third gate driving circuit;

the first reset sub-circuit, the threshold compensation sub-circuit, the driving sub-circuit, the data writing sub-circuit, the first light-emitting control sub-circuit, the second light-emitting control sub-circuit and the second reset sub-circuit each include at least one transistor;

the transistor in each of the first reset sub-circuit and the threshold compensation sub-circuit adopts a metal oxide transistor;

the transistor in each of the driving sub-circuit, the data writing sub-circuit, the first light-emitting control sub-circuit, the second light-emitting control sub-circuit and the second reset sub-circuit adopts a low-temperature polysilicon transistor.

In some implementations, the plurality of pixel driving circuits are arranged in an array;

the first gate driving circuit includes a plurality of first shift registers which are sequentially cascaded;

the second gate driving circuit includes a plurality of second shift registers which are sequentially cascaded;

the third gate driving circuit includes a plurality of third shift registers which are sequentially cascaded;

each first shift register is correspondingly connected with two rows of pixel driving circuits;

each second shift register is correspondingly connected with four rows of pixel driving circuits; and each third shift register is correspondingly connected with two rows of pixel driving circuits.

In some implementations, $(2n-1)^{th}$ first shift registers and $(2n)^{th}$ first shift registers are respectively arranged in the border areas at two opposite sides at the periphery of the display area;

the $(2n-1)^{th}$ first shift registers are sequentially arranged along a column direction in which the pixel driving circuits are arranged; the $(2n)^{th}$ first shift registers are sequentially arranged along the column direction in which the pixel driving circuits are arranged;

$(2n-1)^{th}$ second shift registers and $(2n)^{th}$ second shift registers are respectively arranged in the border areas at two opposite sides at the periphery of the display area;

the $(2n-1)^{th}$ second shift registers are sequentially arranged along the column direction in which the pixel driving circuits are arranged; the $(2n)^{th}$ second shift registers are sequentially arranged along the column direction in which the pixel driving circuits are arranged;

$(2n-1)^{th}$ third shift registers and $(2n)^{th}$ third shift registers are respectively arranged in the border areas on two opposite sides at the periphery of the display area;

the $(2n-1)^{th}$ third shift registers are sequentially arranged along the column direction in which the pixel driving circuits are arranged; the $(2n)^{th}$ third shift registers are sequentially arranged along the column direction in which the pixel driving circuits are arranged; and where n is an integer not less than 1.

In some implementations, in any one of the border areas on two opposite sides at the periphery of the display area, a region where one of the first shift registers is arranged corresponds to a region where of one of the second shift registers is arranged;

a region where one of the first shift registers is arranged corresponds to a region where four of the third shift registers are arranged.

In a second aspect, an embodiment of the present disclosure further provides a display panel, which includes the display substrate described above.

In a third aspect, an embodiment of the present disclosure further provides a display device, which includes the display panel described above.

BRIEF DESCRIPTION OF DRAWINGS

The accompanying drawings are included to provide a further understanding of the embodiments of the present disclosure, and are incorporated in and constitute a part of this specification, illustrate the principles of the present disclosure together with the embodiments of the present disclosure and not to limit the present disclosure. The above and other features and advantages will become more apparent to those skilled in the art by describing in detail exemplary embodiments thereof with reference to the accompanying drawings, in which.

DETAIL DESCRIPTION OF EMBODIMENTS

Figure 1:
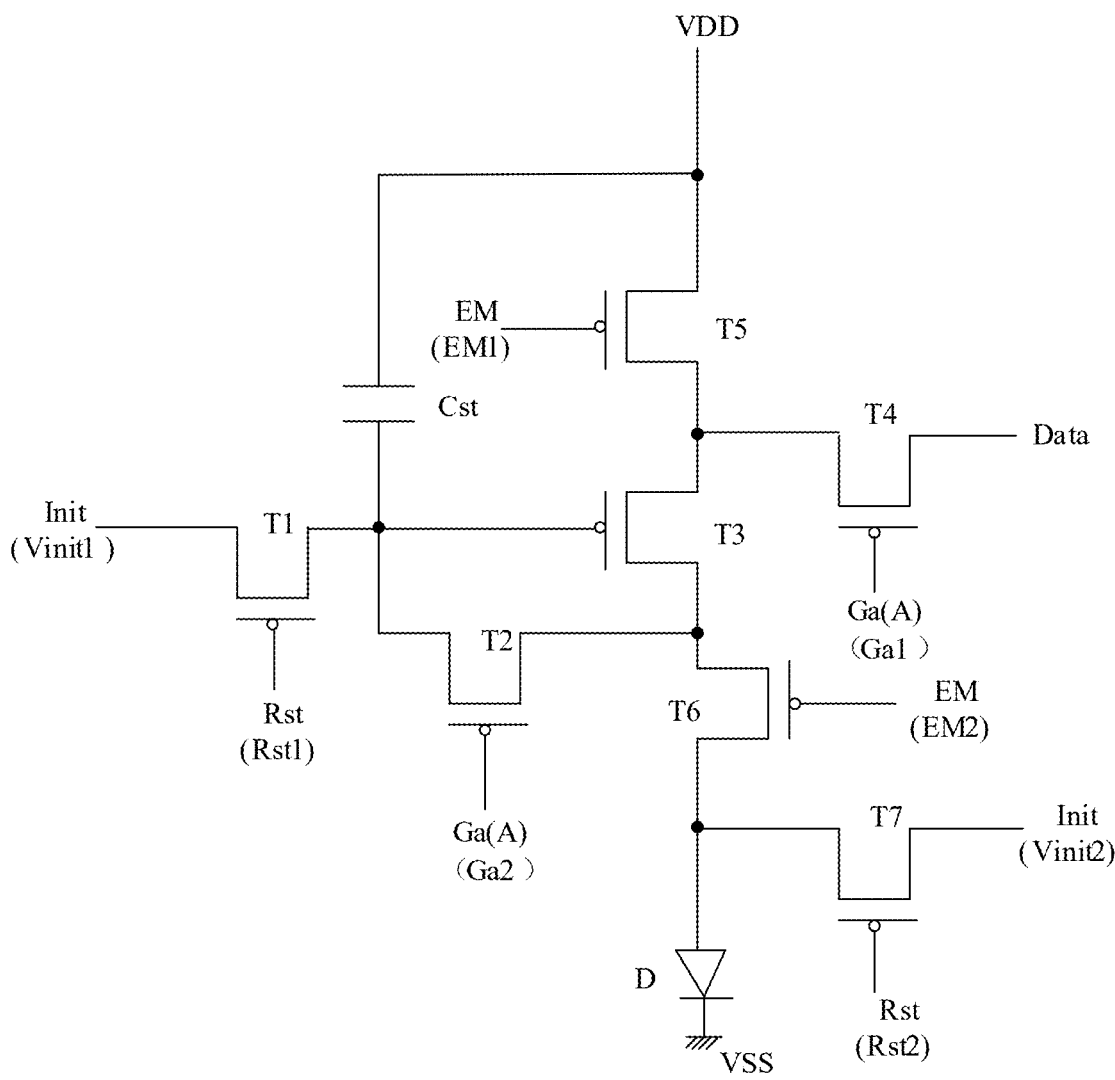
FIG. 1 is a circuit diagram of a pixel driving circuit in a low temperature polysilicon organic light-emitting diode (LTPS-OLED) display panel.

In order to make those skilled in the art better understand the technical solutions of the embodiments of the present disclosure, the following describes a display substrate, a display panel and a display device provided in the embodiments of the present disclosure in further detail with reference to the accompanying drawings and the detailed implementations.

The embodiments of the present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to those skilled in the art.

The embodiments of the present disclosure are not limited to the embodiments shown in the drawings, but include modifications of configurations formed based on a manufacturing process. Thus, the regions illustrated in the figures have schematic properties, and shapes of the regions shown in the figures illustrate specific shapes of the regions, but are not intended to be limiting.

FIG. 1 is a circuit diagram of a pixel driving circuit in a low temperature polysilicon organic light-emitting diode (LTPS-OLED) display panel, referring to FIG. 1. The pixel driving circuit includes a first reset transistor, a threshold compensation transistor, a driving transistor, a data writing transistor, a first light-emitting control transistor, a second light-emitting control transistor, a second reset transistor, and a storage capacitor. All transistors in the pixel driving circuit are P-type transistors with channels made of a low-temperature polysilicon material.

Figure 2:
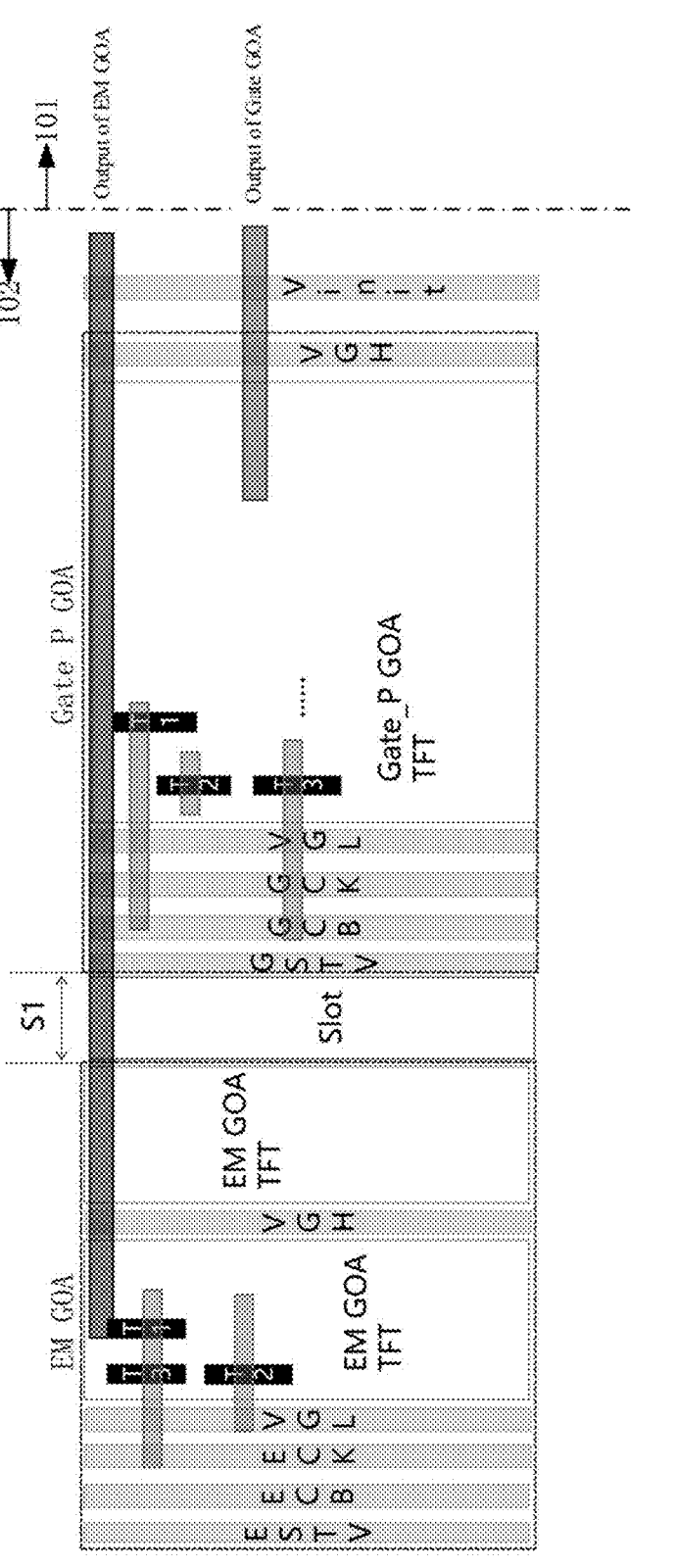
FIG. 2 is a schematic top view of an arrangement of gate driving circuits for providing gate driving signals to transistors of the pixel driving circuit of FIG. 1.

FIG. 2 is a schematic top view of an arrangement of gate driving circuits for providing gate driving signals to transistors of the pixel driving circuit of FIG. 1. The gate driving circuit for providing the gate driving signal to the pixel driving circuit includes a gate driving circuit for light-emitting control (i.e., EM GOA), a gate driving circuit for threshold compensation control and data writing control, and a gate driving circuit for first reset control and second reset control (i.e., Gate P GOA). A first gap S1 is formed between the EM GOA and the Gate P GOA. The gate driving circuits for providing the gate driving signals to the pixel driving circuit are located in border areas 102 on two opposite sides at the periphery of a display area 101 of the display panel.

Figure 3:
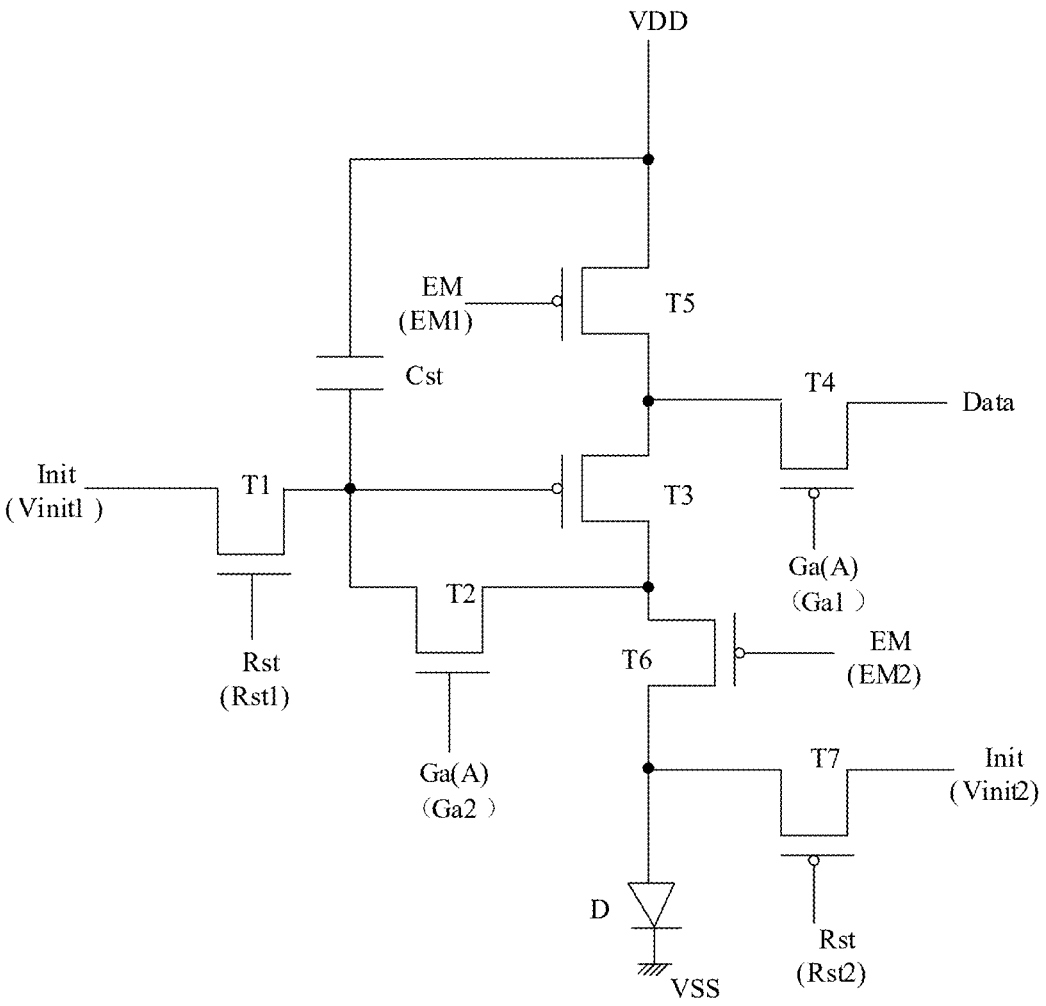
FIG. 3 is a circuit diagram of a pixel driving circuit of a LTPS-OLED display panel.

In the present disclosure, referring to FIG. 3, a circuit diagram of a pixel driving circuit of a LTPS-OLED display panel is shown. The pixel driving circuit also includes a first reset transistor, a threshold compensation transistor, a driving transistor, a data writing transistor, a first light-emitting control transistor, a second light-emitting control transistor, a second reset transistor, and a storage capacitor. The first reset transistor and the threshold compensation transistor are N-type transistors with channels made of metal oxide materials; the driving transistor, the data writing transistor, the first light-emitting control transistor, the second light-emitting control transistor and the second reset transistor are P-type transistors with channels made of low-temperature polycrystalline silicon materials.

Figure 4:
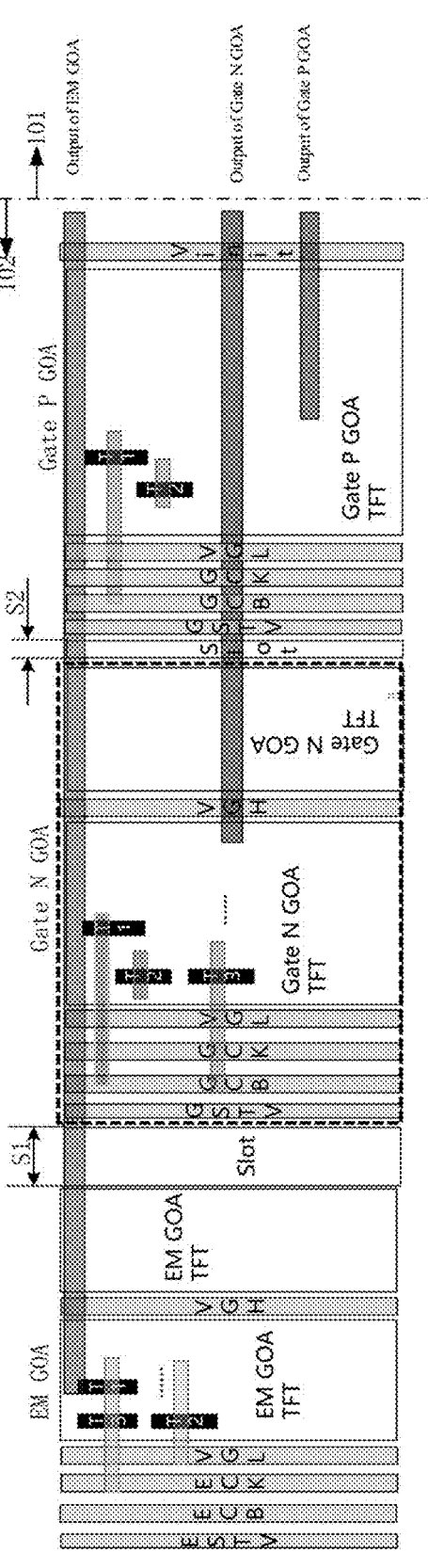
FIG. 4 is a schematic top view of an arrangement of gate driving circuits for providing gate driving signals to transistors of the pixel driving circuit in FIG. 3.

FIG. 4 is a schematic top view of an arrangement of gate driving circuits for providing gate driving signals to transistors of the pixel driving circuit in FIG. 3. Compared to the pixel driving circuit in FIG. 1, the pixel driving circuit in FIG. 3 includes N-type transistors in addition to P-type transistors, so that compared to the gate driving circuit in FIG. 2, the gate driving circuit in FIG. 4 further includes gate driving circuits (i.e., Gate N GOA) that provide gate driving signals to the N-type transistors (i.e., the first reset transistor and the threshold compensation transistor). A second gap S2 is formed between the Gate N GOA and the Gate P GOA. Therefore, compared to the LTPS OLED display panel, the LTPO-OLED display panel needs to be additionally arranged with corresponding Gate N GOA circuits in the border areas on opposite two sides at the periphery of the display area of the LTPO-OLED display panel in addition to the arrangement of the EM GOA circuits and the Gate P GOA circuits, which may greatly increase a width of each border area of the LTPO-OLED display panel. For example, a width of the Gate N GOA circuit is about 200 m, the width of the corresponding border area needs to be increased by about 20% of the original width, that is, the width of each of the border areas on the left and right sides of the display panel is increased from 1.0 mm for the LTPS-OLED display panel in the related art to 1.2 mm for the LTPO-OLED display panel in the related art; therefore, the introduction of the Gate N GOA circuits will greatly influence the development of narrow bezel design of LTPO-OLED display products in the future.

Figure 5:
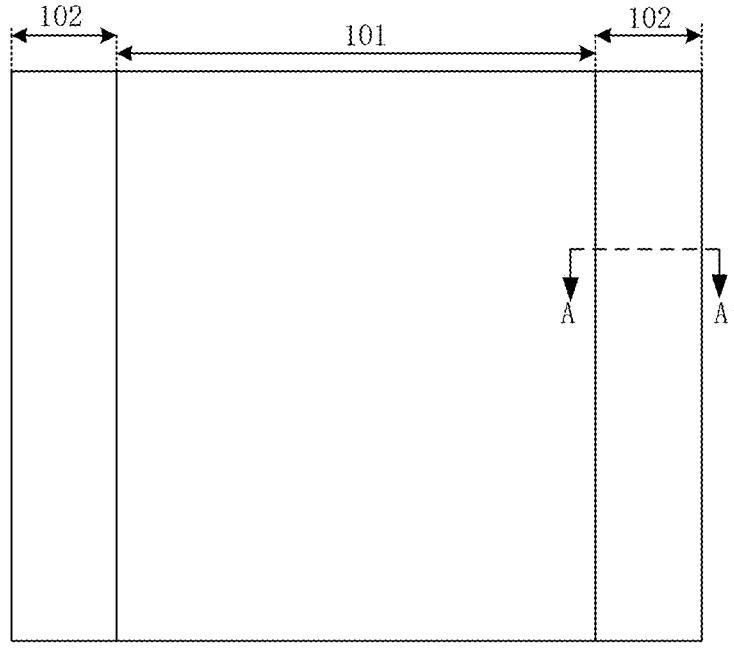
FIG. 5 is a schematic top view showing regions of a LTPO-OLED display panel with the pixel driving circuit of FIG. 3 in the related art.
Figure 6:
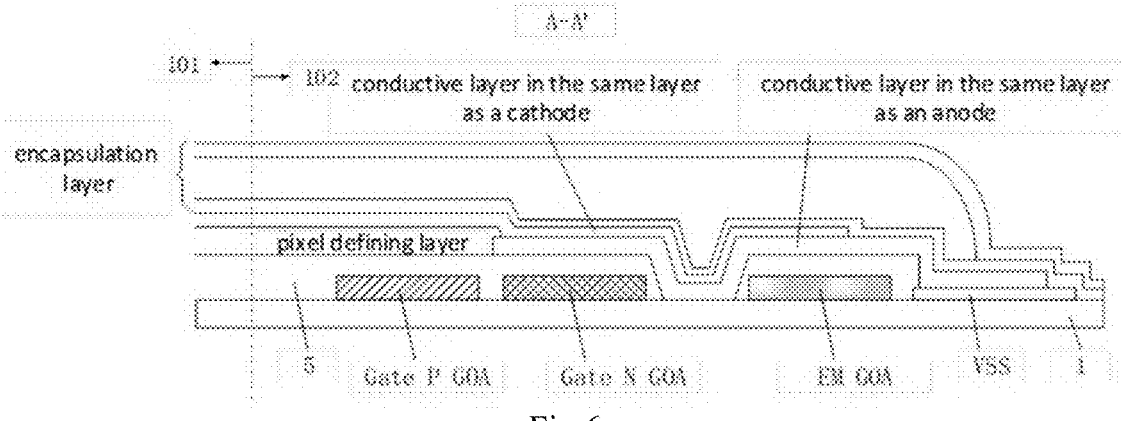
FIG. 6 is a cross-sectional view of a structure in FIG. 5 taken along a cutting line AA'.
Figure 7:
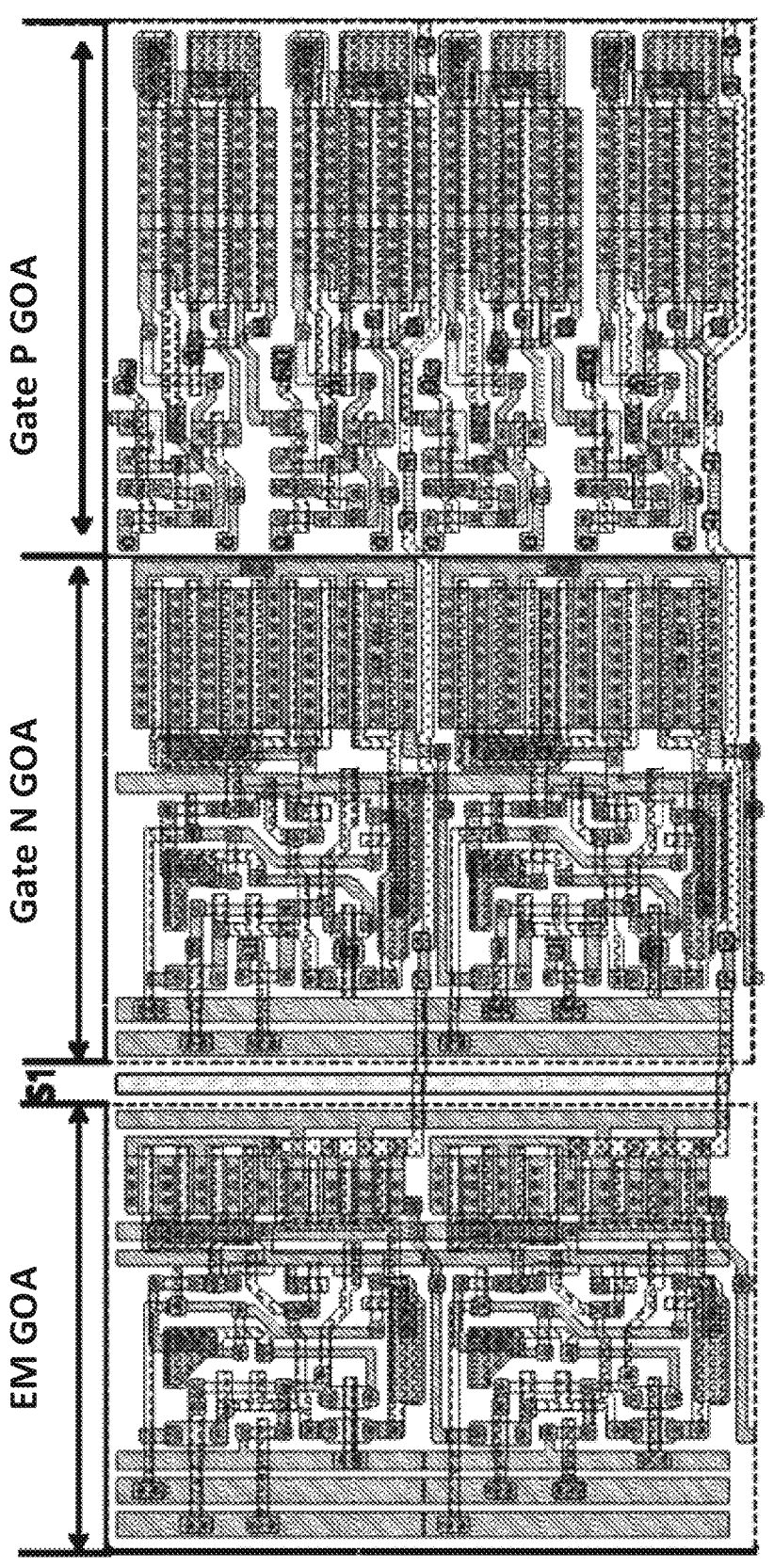
FIG. 7 is a schematic layout diagram of an arrangement of gate driving circuits in a border area on a side of the LTPO-OLED display panel in FIG. 5.

FIG. 5 is a schematic top view showing regions of a LTPO-OLED display panel with the pixel driving circuit of FIG. 3 in the related art, FIG. 6 is a cross-sectional view of a structure in FIG. 5 taken along a cutting line AA', FIG. 7 is a schematic layout diagram of an arrangement of gate driving circuits in a border area on a side of the LTPO-OLED display panel in FIG. 5. As can be seen from FIG. 6, the gate driving circuits for providing gate driving signals to the transistors in the pixel driving circuit are located on a base substrate, and the Gate P GOA circuit, the Gate N GOA circuit, and the EM GOA circuit are sequentially arranged away from the display area and are not overlapped with each other. In the display area, the pixel driving circuit is formed on a base substrate 1, and a planarization layer 5 is formed on a side of the pixel driving circuit away from the base substrate 1, so as to from film layers of the OLED light-emitting element on a flat surface of the planarization layer 5 away from the base substrate 1; the planarization layer 5 further extends from the display area 101 to the border area 102, and covers the gate driving circuits in the border area 102. In the related art, referring to FIGS. 6 and 7, a gap is formed between every adjacent two of the Gate P GOA circuit, the Gate N GOA circuit and the EM GOA circuit, and each gap is formed by forming a groove in or breaking insulating film layers (such as a gate insulating layer, a passivation layer and the like) between the adjacent two of the Gate P GOA circuit, the EM GOA circuit and the Gate N GOA circuit; the planarization layer 5 is cut off by the gap between the Gate N GOA circuit and the EM GOA circuit.

Figure 8:
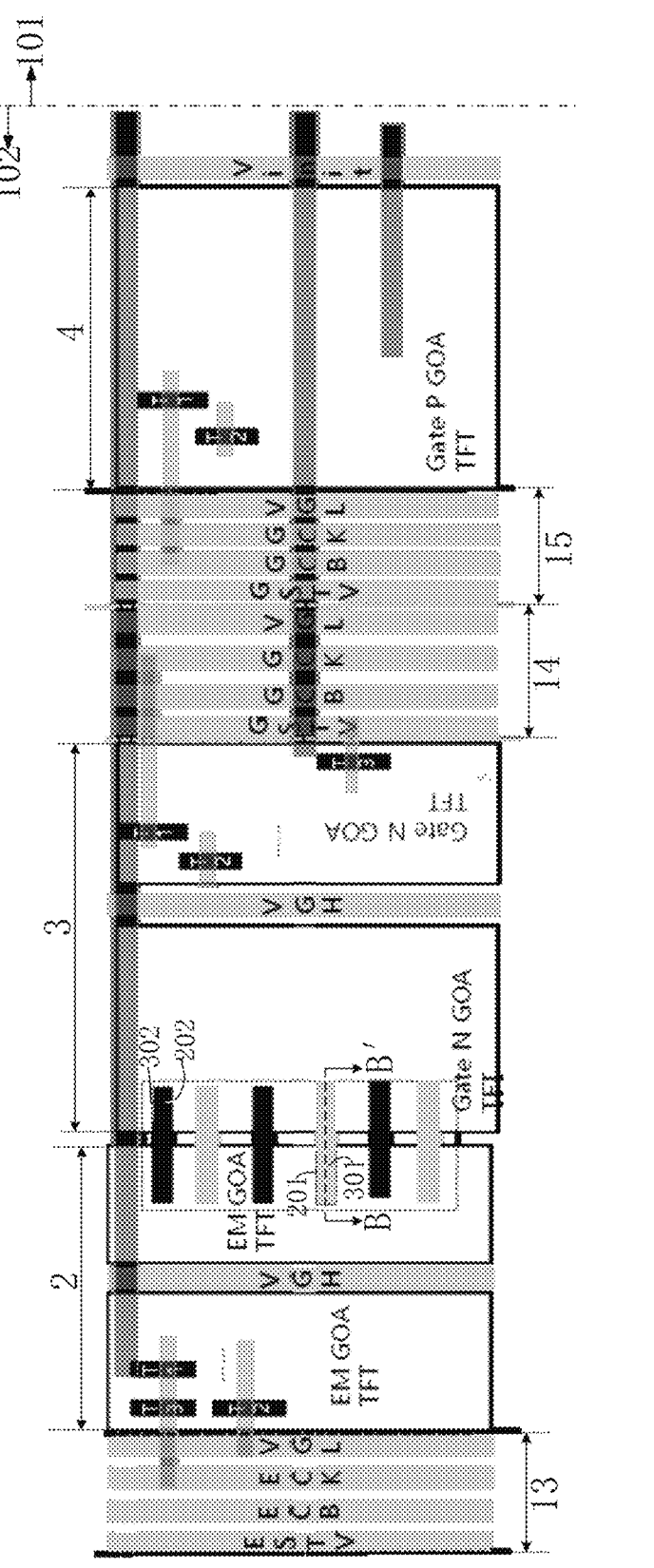
FIG. 8 is a schematic layout diagram of an arrangement of gate driving circuits in a border area of a display substrate according to an embodiment of the present disclosure.
Figure 9:
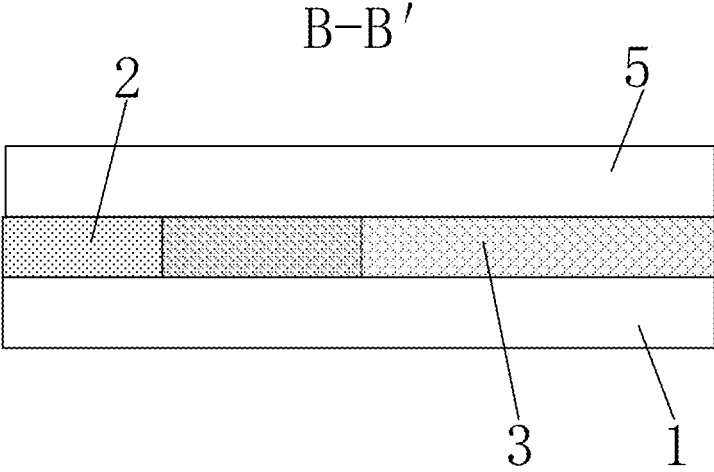
FIG. 9 is a cross-sectional view of the structure in FIG. 8 taken along a cutting line BB'.

In order to solve the technical problem that the width of the border area is increased due to the introduction of a Gate N GOA circuit in the border area in the related art, in a first aspect, an embodiment of the present disclosure provides a display substrate, FIG. 8 is a schematic layout diagram of an arrangement of gate driving circuits in a border area of a display substrate according to an embodiment of the present disclosure, FIG. 9 is a cross-sectional view of the structure in FIG. 8 taken along a cutting line BB', as shown in FIGS. 8 and 9, the display substrate includes: a base substrate 1; a plurality of light-emitting elements located in the display area 101; a plurality of pixel driving circuits located on the base substrate 1, where the light-emitting elements are located on a side of the pixel driving circuits far away from the base substrate 1, the pixel driving circuits are correspondingly connected with the light-emitting elements, respectively, each of the pixel driving circuits includes an N-type transistor and a P-type transistor; a first gate driving circuit 2, a second gate driving circuit 3 and a third gate driving circuit 4 are located on the base substrate 1 and at least located in a border area 102 at the periphery of the display area 101. The first gate driving circuit 2 and the third gate driving circuit 4 are connected with P-type transistors in the respective pixel driving circuits, the second gate driving circuit 3 is connected with N-type transistors in the respective pixel driving circuits. The third gate driving circuit 4, the second gate driving circuit 3 and the first gate driving circuit 2 are sequentially arranged along a direction away from the display area 101, and orthographic projections of the third gate driving circuit, the second gate driving circuit and the first gate driving circuit on the base substrate 1 are not overlapped with each other. Adjacent boundary areas of the orthographic projections of the first gate driving circuit 2 and the second gate driving circuit 3 on the base substrate 1 are at least partially nested. A planarization layer 5 located is between the pixel driving circuit and the light-emitting element and further extends to form an entire surface to cover the first gate driving circuit 2, the second gate driving circuit 3 and the third gate driving circuit 4.

The boundary area of the first gate driving circuit 2 refers to a partial boundary area of a region where an orthographic projection of a circuit portion of the first gate driving circuit 2 on the base substrate 1 is located; the boundary area of the second gate driving circuit 3 refers to a partial boundary area of a region where an orthographic projection of a circuit portion of the second gate driving circuit 3 on the base substrate 1 is located. The adjacent boundary areas of orthographic projections of the first gate driving circuit 2 and the second gate driving circuit 3 on the base substrate 1 being at least partially nested means that: the circuit in the boundary area of the first gate driving circuit 2 is partially arranged in an area, where no circuit is provided, of a region where the second gate driving circuit 3 is arranged, and the circuit in the boundary area of the second gate driving circuit 3 is partially arranged in an area, where no circuit is provided, of a region where the first gate driving circuit 2 is arranged.

In some implementations, referring to FIG. 8, a part of the boundary area of the first gate driving circuit 2 proximal to the second gate driving circuit 3 is formed therein with a first notch portion 201; a part of the boundary area of the second gate driving circuit 3 proximal to the first gate driving circuit 2 extends to a region where the first gate driving circuit 2 is located to form a first protruding portion 301; the first protruding portion 301 is correspondingly located in the first notch portion 201, and orthographic projections of the first protruding portion 301 and the first notch portion 201 on the base substrate 1 are matched with each other in shape.

In some implementations, referring to FIG. 8, a part of the boundary area of the second gate driving circuit 3 proximal to the first gate driving circuit 2 is formed therein with a second notch portion 302; a part of the boundary area of the first gate driving circuit 2 proximal to the second gate driving circuit 3 extends to a region where the second gate driving circuit 3 is located to form a second protruding portion 202; the second protruding portion 202 is correspondingly located in the second notch portion 302, and orthographic projections of the second protruding portion 202 and the second notch portion 302 on the base substrate 1 are matched with each other in shape.

In some implementations, referring to FIG. 8, in the boundary area of the first gate driving circuit 2 adjacent to the second gate driving circuit 3, part of wirings of the first gate driving circuit 2 extend to the region where the second gate driving circuit 3 is located.

In some implementations, in the boundary area of the second gate driving circuit adjacent to the first gate driving circuit, part of wirings of the second gate driving circuit extend to the region (not shown) where the first gate driving circuit is located.

Figure 10:
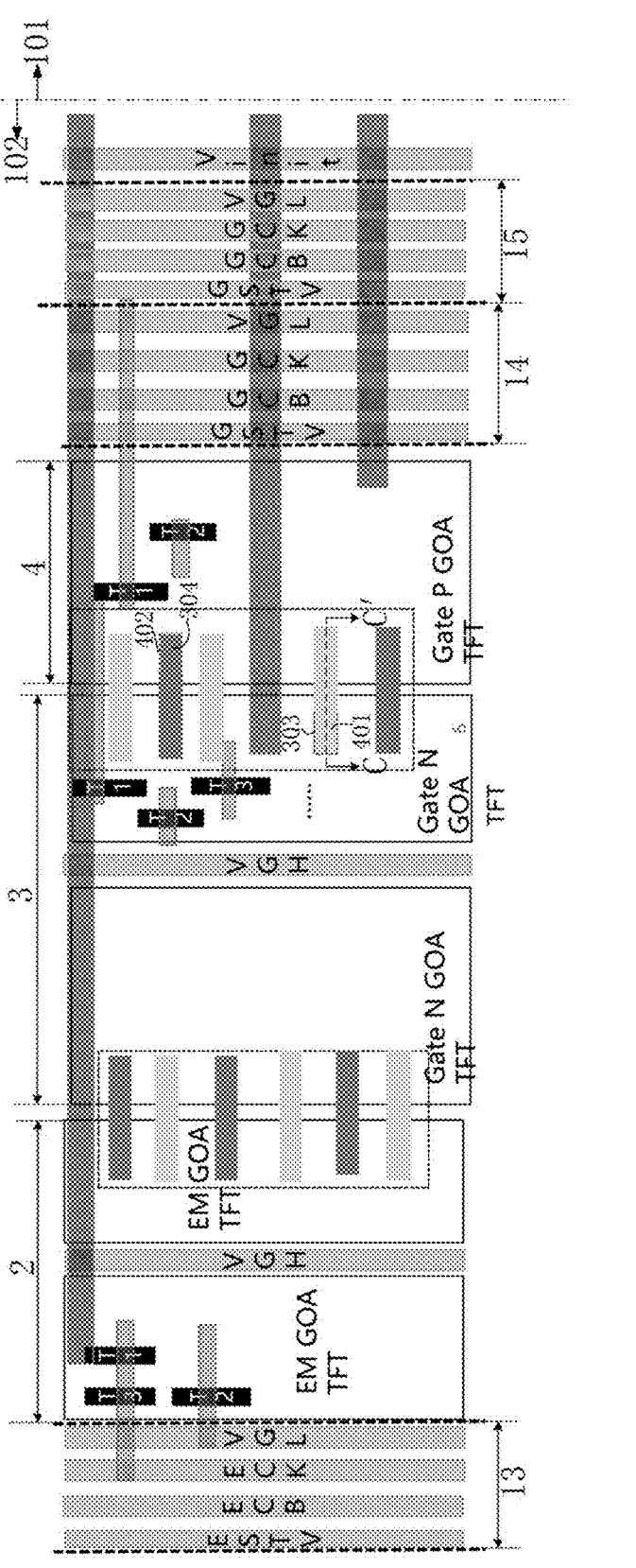
FIG. 10 is a schematic layout diagram of an arrangement of gate driving circuits in a border area of a display substrate according to an embodiment of the present disclosure.
Figure 11:
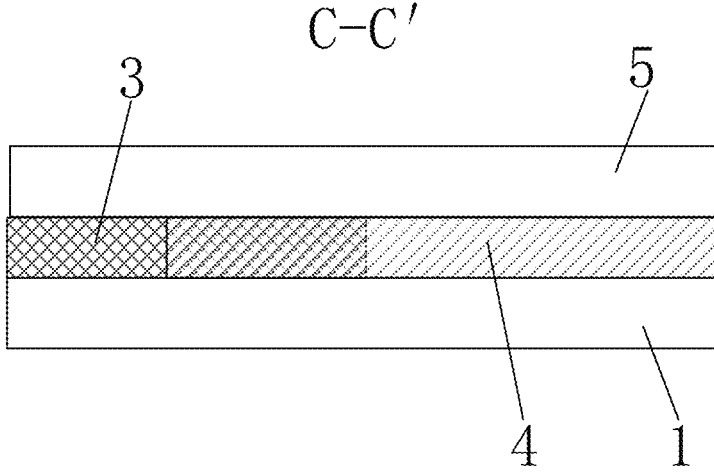
FIG. 11 is a cross-sectional view of the structure in FIG. 10 taken along a cutting line CC'.

FIG. 10 is a schematic layout diagram showing another arrangement of the gate driving circuits in the border area of the display substrate in an embodiment of the present disclosure, FIG. 11 is a cross-sectional view of the structure in FIG. 10 taken along a cutting line CC', as shown in these figures, in some implementations, the adjacent boundary areas of the orthographic projections of the second gate driving circuit 3 and the third gate driving circuit 4 on the base substrate 1 are at least partially nested.

The boundary area of the third gate driving circuit 4 refers to a partial boundary area of a region where an orthographic projection of a circuit of the third gate driving circuit 4 on the base substrate 1 is located. The adjacent boundary areas of the orthographic projections of the second gate driving circuit 3 and the third gate driving circuit 4 on the base substrate 1 being at least partially nested refers to that: the circuit in the boundary area of the second gate driving circuit 3 is partially arranged in an area, where no circuit is provided, of a region where the third gate driving circuit 4 is arranged, and the circuit in the boundary area of the third gate driving circuit 4 is partially arranged in an area, where no circuit is provided, of a region where the second gate driving circuit 3 is arranged.

In some implementations, referring to FIG. 10, a third notch portion 303 is partially formed at the boundary area of the second gate driving circuit 3 proximal to the third gate driving circuit 4; a part of the boundary area of the third gate driving circuit 4 proximal to the second gate driving circuit 3 extends to the region where the second gate driving circuit 3 is located to form a third protruding portion 401; the third protruding portion 401 is correspondingly located in the third notch portion 303, and orthographic projections the third protruding portion 401 and the third notch portion 303 on the base substrate 1 are matched with each other in shape.

In some implementations, referring to FIG. 10, the boundary area of the third gate driving circuit 4 proximal to the second gate driving circuit 3 is partially formed therein with a fourth notch portion 402; a part of the boundary area of the second gate driving circuit 3 proximal to the third gate driving circuit 4 extends to the region where the third gate driving circuit 4 is located to form a fourth protruding portion 304; the fourth protruding portion 304 is correspondingly located in the fourth notch portion 402, and orthographic projections of the fourth protruding portion 304 and the fourth notch portion 402 on the base substrate 1 are matched with each other in shape.

In some implementations, referring to FIG. 10, in the adjacent boundary areas of the second gate driving circuit 3 and the third gate driving circuit 4, part of wirings of the second gate driving circuit 3 extend to the region where the third gate driving circuit 4 is located.

In some implementations, in the adjacent boundary areas of the second gate driving circuit and the third gate driving circuit, a part of wiring of the third gate driving circuit extends to the region (not shown) where the second gate driving circuit is located.

Compared to the design in the related art that gaps are formed between every adjacent two of the Gate P GOA circuit, the Gate N GOA circuit and the EM GOA circuit, the gaps are formed by forming grooves in or breaking insulating film layers (such as a gate insulating layer, a passivation layer and the like) between every adjacent two of the Gate P GOA circuit, the Gate N GOA circuit and the EM GOA circuit, and the planarization layer is broken at the gap between the Gate N GOA circuit and the EM GOA circuit, in the embodiment of the present disclosure, no gap is provided between every two adjacent boundary areas of the first gate driving circuit 2, the second gate driving circuit 3 and the third gate driving circuit 4, and the planarization layer 5 is not broken between any two adjacent boundary areas of the first gate driving circuit 2, the second gate driving circuit 3 and the third gate driving circuit 4, but is formed into an entire surface, in such way, the gap between any two adjacent ones of the first gate driving circuit 2, the second gate driving circuit 3 and the third gate driving circuit 4 is cancelled, so that at least parts of circuits in adjacent boundary areas of the first gate driving circuit, the second gate driving circuit and the third gate driving circuit are mutually inserted into space regions where the first gate driving circuit, the second gate driving circuit and the third gate driving circuit are located, respectively, realizing space mixture using or mutual borrowing between any two adjacent gate driving circuits, and the width of the border area 102 of the display substrate can be reduced.

Figure 12A:
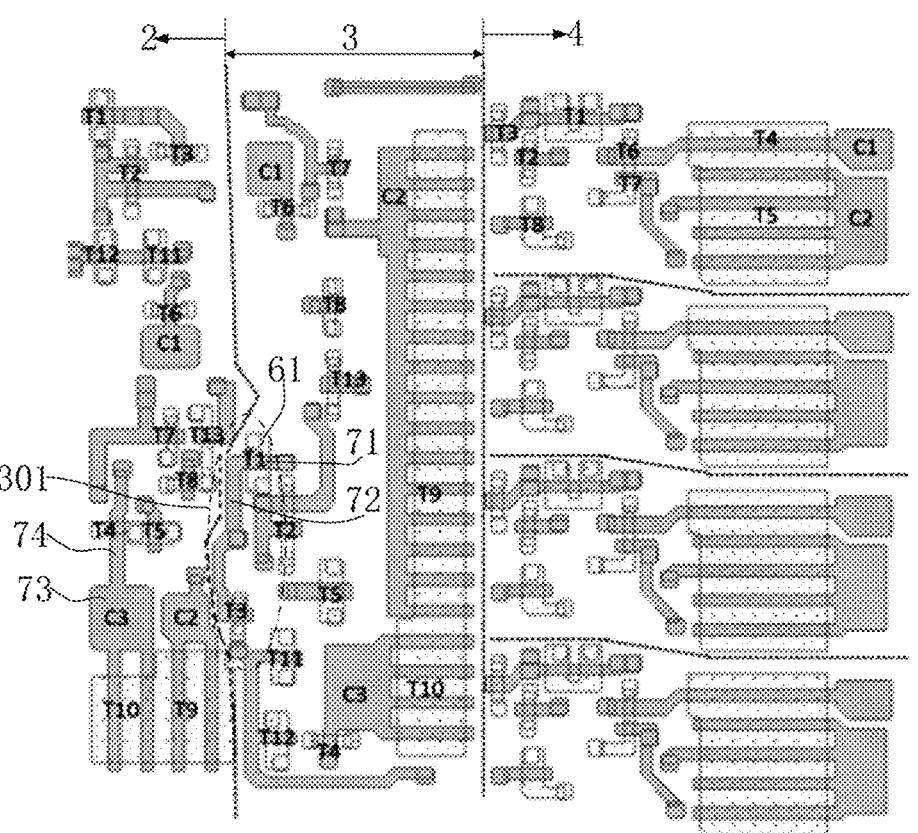
FIG. 12A is a schematic layout diagram showing a first semiconductor layer and a first conductive layer in a border area of a display substrate in an embodiment of the present disclosure.

FIG. 12A a schematic layout diagram showing a first semiconductor layer and a first conductive layer in the border area of a display substrate in an embodiment of the present disclosure, referring to FIG. 12A, in some implementations, the display substrate includes a first semiconductor layer 6 and a first conductive layer 7 which are sequentially stacked on the base substrate, and a gate insulating layer is arranged between the first semiconductor layer 6 and the first conductive layer 7. The first gate driving circuit 2, the second gate driving circuit 3, and the third gate driving circuit 4 each include a plurality of transistors and a plurality of capacitors; the first semiconductor layer 6 includes a pattern of an active layer 61 of each transistor; the first conductive layer 7 includes a pattern of a gate 71 of each transistor, a first connection line 72 connecting to the gate 71, a first plate 73 of each capacitor, and a second connection line 74 connecting to the first plate 73; patterns of part of active layers 61 in the first semiconductor layer 6 are located in the first protruding portion 301; patterns of part of gate electrodes 71 and part of first connection lines 72 in the first conductive layer 7 are located in the first protruding portion 301.

Figure 13:
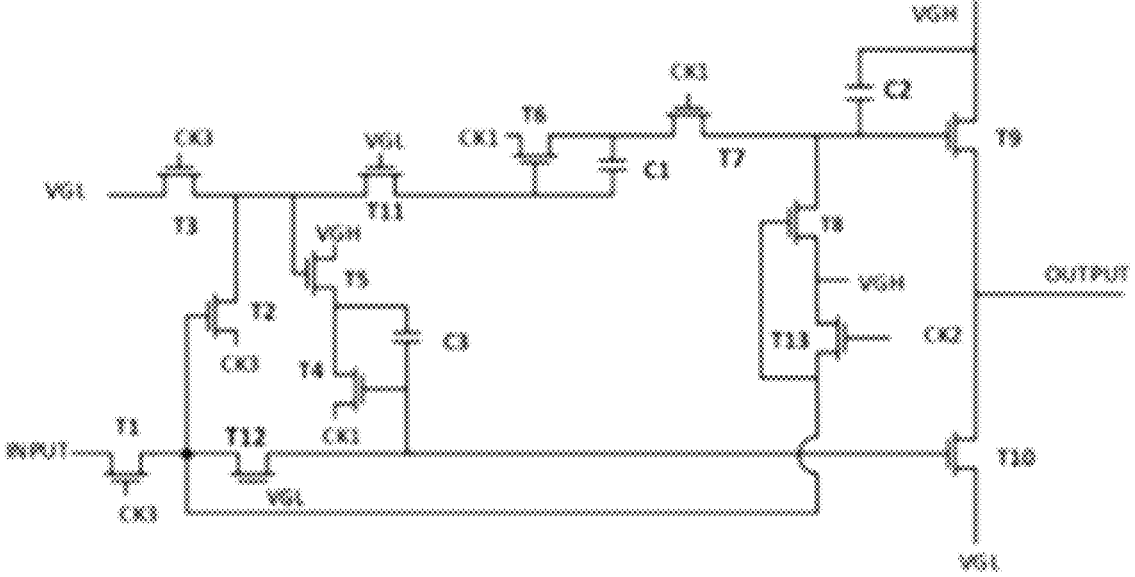
FIG. 13 is a circuit diagram of a shift register unit in a first gate driving circuit in an embodiment of the present disclosure.
Figure 14:
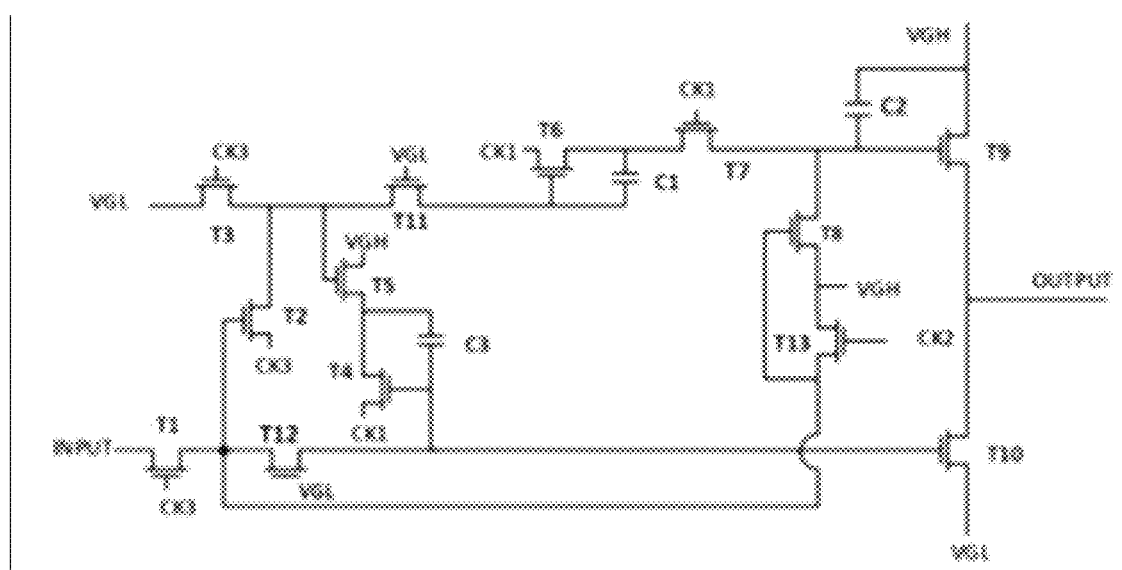
FIG. 14 is a circuit diagram of a shift register unit in a second gate driving circuit in an embodiment of the present disclosure.
Figure 15:
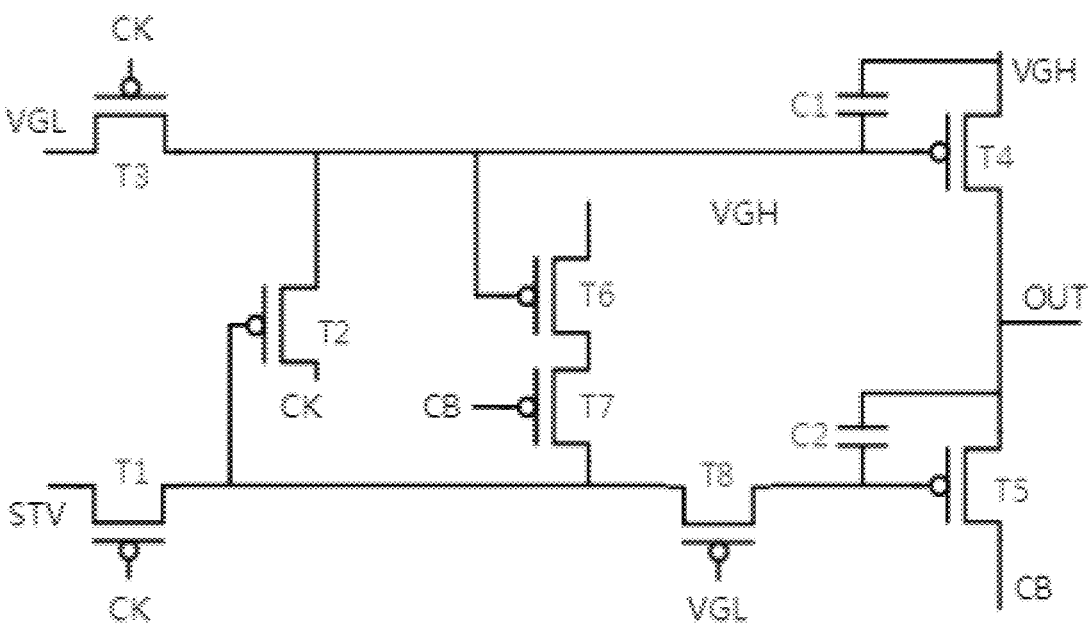
FIG. 15 is a circuit diagram of a shift register unit in a third gate driving circuit in an embodiment of the present disclosure.

FIG. 13 is a circuit diagram of a shift register unit in the first gate driving circuit in an embodiment of the present disclosure, FIG. 14 is a circuit diagram of a shift register unit in the second gate driving circuit in an embodiment of the present disclosure, FIG. 15 is a circuit diagram of a shift register unit in the third gate driving circuit in an embodiment of the present disclosure. Referring to FIG. 12A, the shift register unit in the first gate driving circuit 2 is provided with a first notch portion 201 at a position close to an eighth transistor T8, a fifth transistor T5, and a second capacitor C2; patterns of the gate electrode 71 and the active layer 61 of a first transistor T1, the gate electrode 71 and the active layer 61 of a third transistor T3, the gate electrode 71 of a second transistor T2, and the first connection line 72 connecting the gate electrode 71 of the first transistor T1 to the gate electrode 71 of the third transistor T3 of the shift register unit in the second gate driving circuit 3 are located in the first protruding portion 301.

Figure 12B:
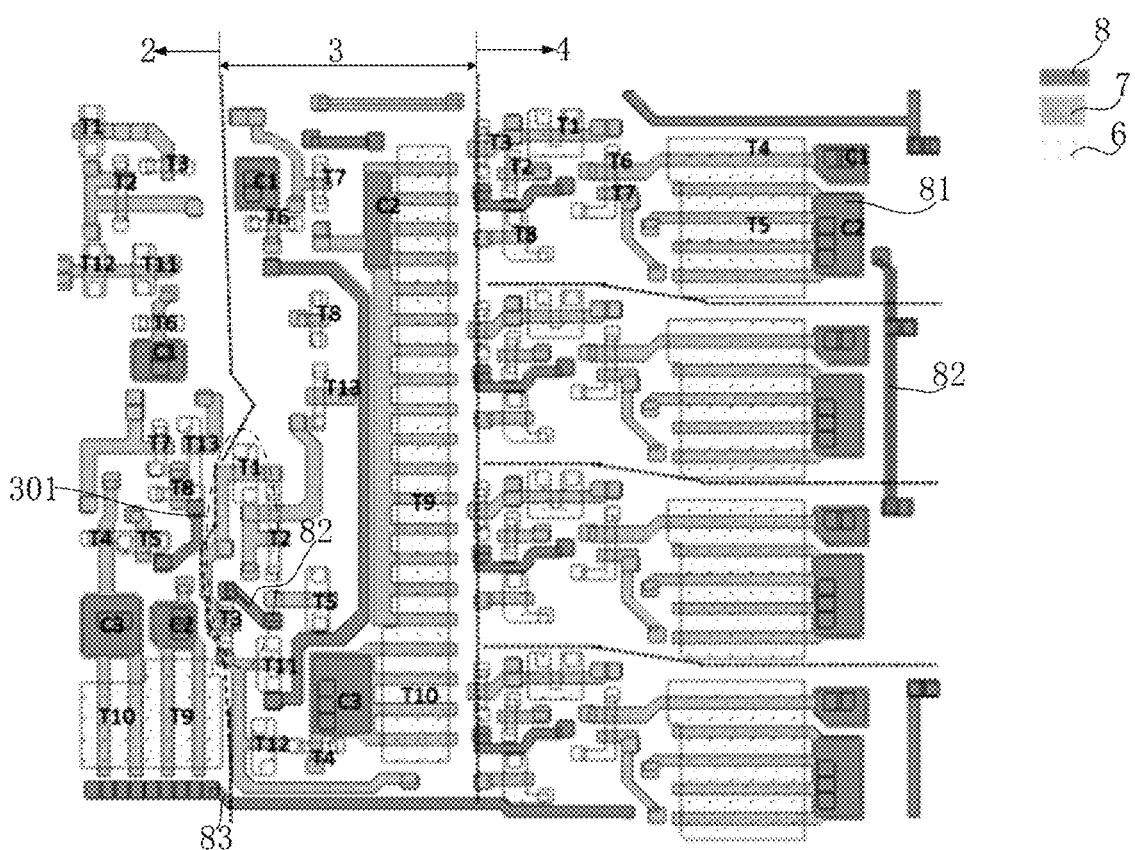
FIG. 12B is a schematic layout diagram showing a second conductive layer in a border area of a display substrate in an embodiment of the present disclosure.

FIG. 12B is a schematic layout diagram showing a second conductive layer in the border area of the display substrate in an embodiment of the present disclosure, referring to FIG. 12B, in some implementations, the display substrate further includes a second conductive layer 8, which is located on a side of the first conductive layer 7 away from the base substrate 1; a first passivation layer is arranged between the second conductive layer 8 and the first conductive layer 7; the second conductive layer 8 includes patterns of second plates 81 of capacitors and third connection lines 82; patterns of part of the third connection lines 82 in the second conductive layer 8 are located in the first protruding portion 301.

In some implementations, referring to FIGS. 14 and 12B, the third connection line 82 is a connection line connecting a source (or a drain) of the second transistor T2, a source (or a drain) of the third transistor T3, and the gate 71 of the fifth transistor T5 in the second gate driving circuit 3 together.

In some implementations, referring to FIG. 12B, the second conductive layer 8 further includes patterns of fourth connection lines 83; part of the fourth connection lines 83 extend from a region where the first gate driving circuit 2 is located to a region where the second gate driving circuit 3 is located.

In some implementations, the fourth connection line 83 is an output line of the first gate driving circuit 2.

In some implementations, part of the fourth connection lines 83 further extend from the region where the second gate driving circuit 3 is located to a region where the third gate driving circuit 4 is located. That is, the output line of the first gate driving circuit 2 also extends from the region where the second gate driving circuit 3 is located to the region where the third gate driving circuit 4 is located.

Figure 12C:
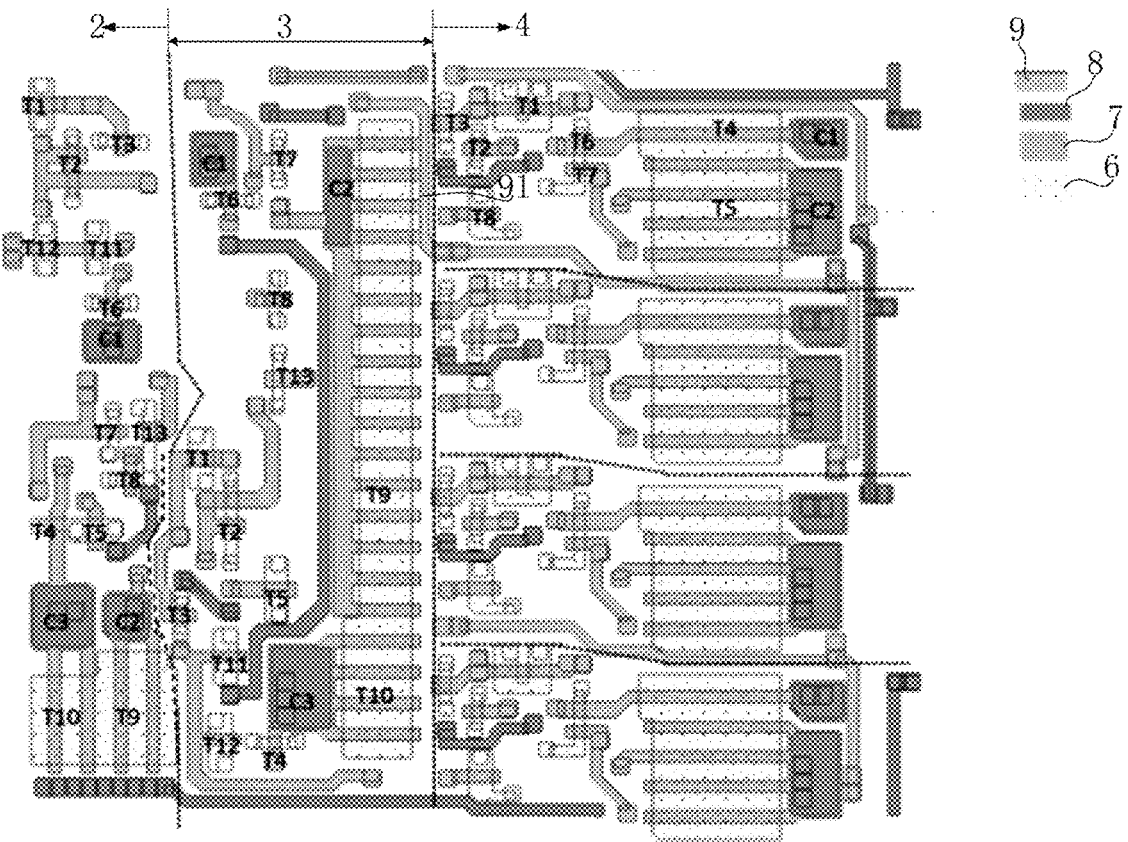
FIG. 12C is a schematic layout diagram showing a third conductive layer in a border area of a display substrate in an embodiment of the present disclosure.

FIG. 12C is a schematic layout diagram showing a third conductive layer in the border area of the display substrate in an embodiment of the present disclosure. Referring to FIG. 12C, in some implementations, the display substrate further includes a third conductive layer 9 located on a side of the second conductive layer 8 away from the base substrate; a second passivation layer is arranged between the third conductive layer 9 and the second conductive layer 8; the third conductive layer 9 includes patterns of fifth connection lines 91; part of the fifth connection lines 91 extend from the region where the second gate driving circuit 3 is located to the region where the third gate driving circuit 4 is located.

In some implementations, the fifth connection line 91 is a signal input line of the second gate driving circuit 3.

Figure 12D:
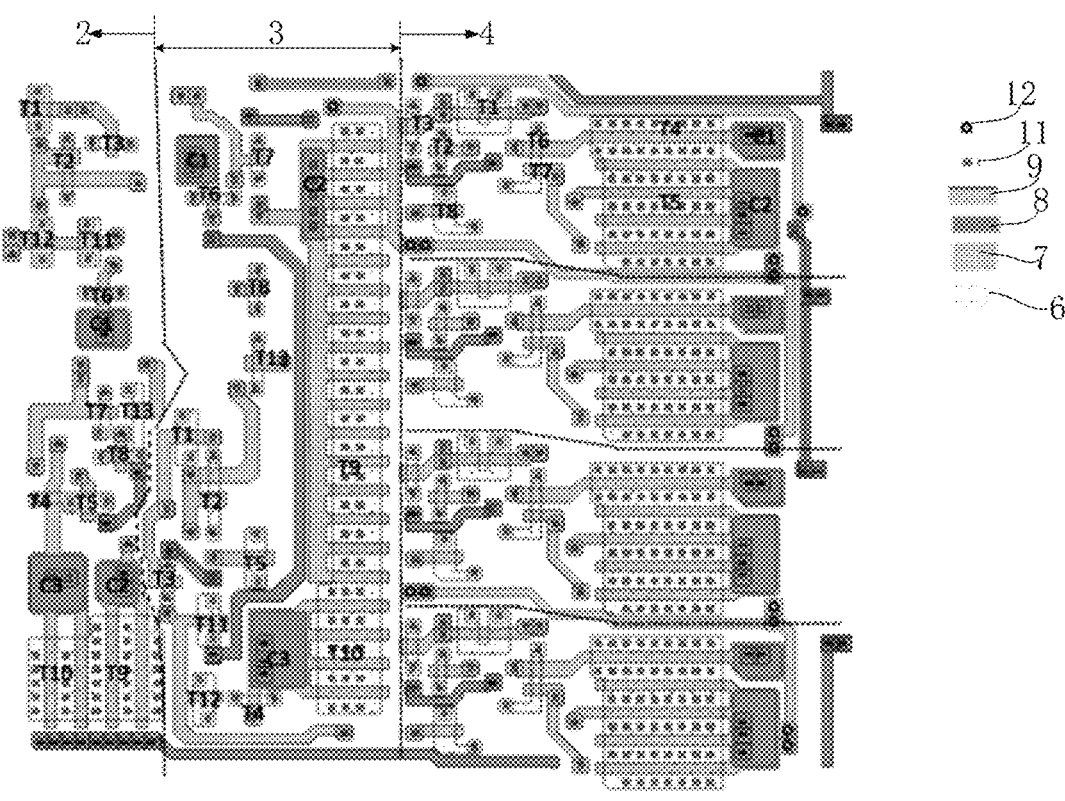
FIG. 12D is a schematic layout diagram showing first layer via holes and second layer via holes in a border area of a display substrate in an embodiment of the present disclosure.
Figure 12E:
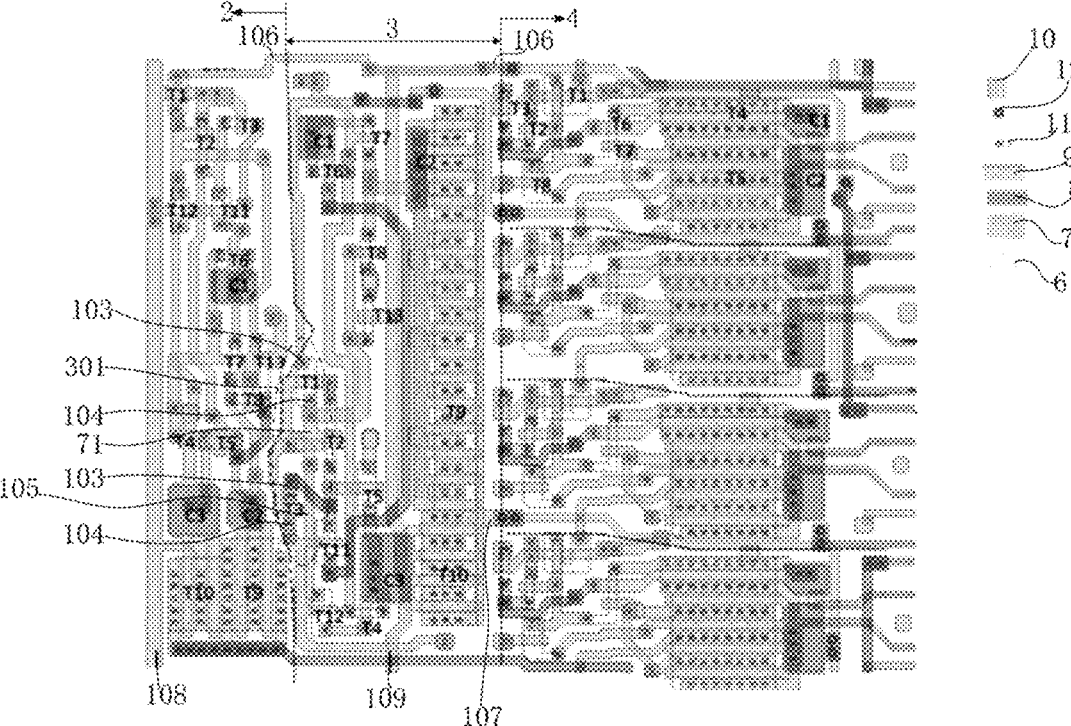
FIG. 12E is a schematic layout diagram showing a fourth conductive layer in a border area of a display substrate in an embodiment of the present disclosure.

FIG. 12D is a schematic layout diagram showing first layer via holes and second layer via holes in the border area of the display substrate in an embodiment of the present disclosure, and FIG. 12E is a schematic layout diagram showing a fourth conductive layer in the border area of the display substrate in an embodiment of the present disclosure. In some implementations, referring to FIGS. 12D and 12E, the display substrate further includes a fourth conductive layer 10, which is located on a side of the third conductive layer 9 away from the base substrate; a first intermediate dielectric layer and a second intermediate dielectric layer (not shown) are arranged between the fourth conductive layer 10 and the third conductive layer 9; the first intermediate dielectric layer and the second intermediate dielectric layer are sequentially stacked away from the third conductive layer 9; first layer via holes 11 are formed in the first intermediate dielectric layer, and the first layer via holes 11 are configured to connect conductive patterns in the fourth conductive layer 10 to conductive patterns in the third conductive layer 9; second layer via holes 12 are formed in the second intermediate dielectric layer, and the second layer via holes 12 are configured to connect conductive patterns in the fourth conductive layer 10 to conductive patterns in the first conductive layer 7 and conductive patterns in the second conductive layer 8 respectively. The fourth conductive layer 10 includes patterns of the source 103 and the drain 104 of each transistor, and sixth connection lines 105; the sixth connection line 105 is configured to connect the source 103, the drain 104 and the gate 71; patterns of part of the source electrodes 103, part of the drain electrodes 104 and part of the sixth connection lines 105 in the fourth conductive layer 10 are located in the first protruding portion 301.

The patterns of the source 103 and the drain 104 of the transistor in the fourth conductive layer 10 refers to patterns of the source 103 and the drain 104 of each of the transistors in the first gate driving circuit 2, the second gate driving circuit 3, and the third gate driving circuit 4; the patterns of the sixth connection lines 105 in the fourth conductive layer 10 refers to connection lines connected between the sources 103, the drains 104, and/or the gates 71 of the transistors in the first gate driving circuit 2, the second gate driving circuit 3, and the third gate driving circuit 4, respectively, according to the respective circuit connection relationships of the first gate driving circuit 2, the second gate driving circuit 3 and the third gate driving circuit 4.

In some implementations, the patterns, in the fourth conductive layer 10, of the source 103 and the drain 104 of the first transistor T1, the source 103 and the drain 104 of the third transistor T3, and a part of the sixth connection lines 105 connecting the source 103 (or the drain 104) of the first transistor T1, a source 103 (or a drain 104) of a twelfth transistor T12, the gate 71 of the second transistor T2, and the source 103 (or the drain 104) of the third transistor T3 in the second gate driving circuit 3 are located in the first protruding portion 301.

In some implementations, referring to FIG. 12E, the fourth conductive layer 10 further includes patterns of seventh connection lines 106; part of the seventh connection lines 106 extends from the region where the first gate driving circuit 2 is located to the region where the second gate driving circuit 3 is located; part of the seventh connection lines 106 extends from the region where the second gate driving circuit 3 is located to the region where the third gate driving circuit 4 is located.

In some implementations, the seventh connection line 106 is an input line of the first gate driving circuit 2.

In some implementations, referring to FIG. 12E, the fourth conductive layer 10 further includes patterns of eighth connection lines 107; a part of the eighth connection lines 107 extends from the region where the second gate driving circuit 3 is located to the region where the third gate driving circuit 4 is located.

In some implementations, the eighth connection line 107 is an output line of the second gate driving circuit 3.

Figure 16:
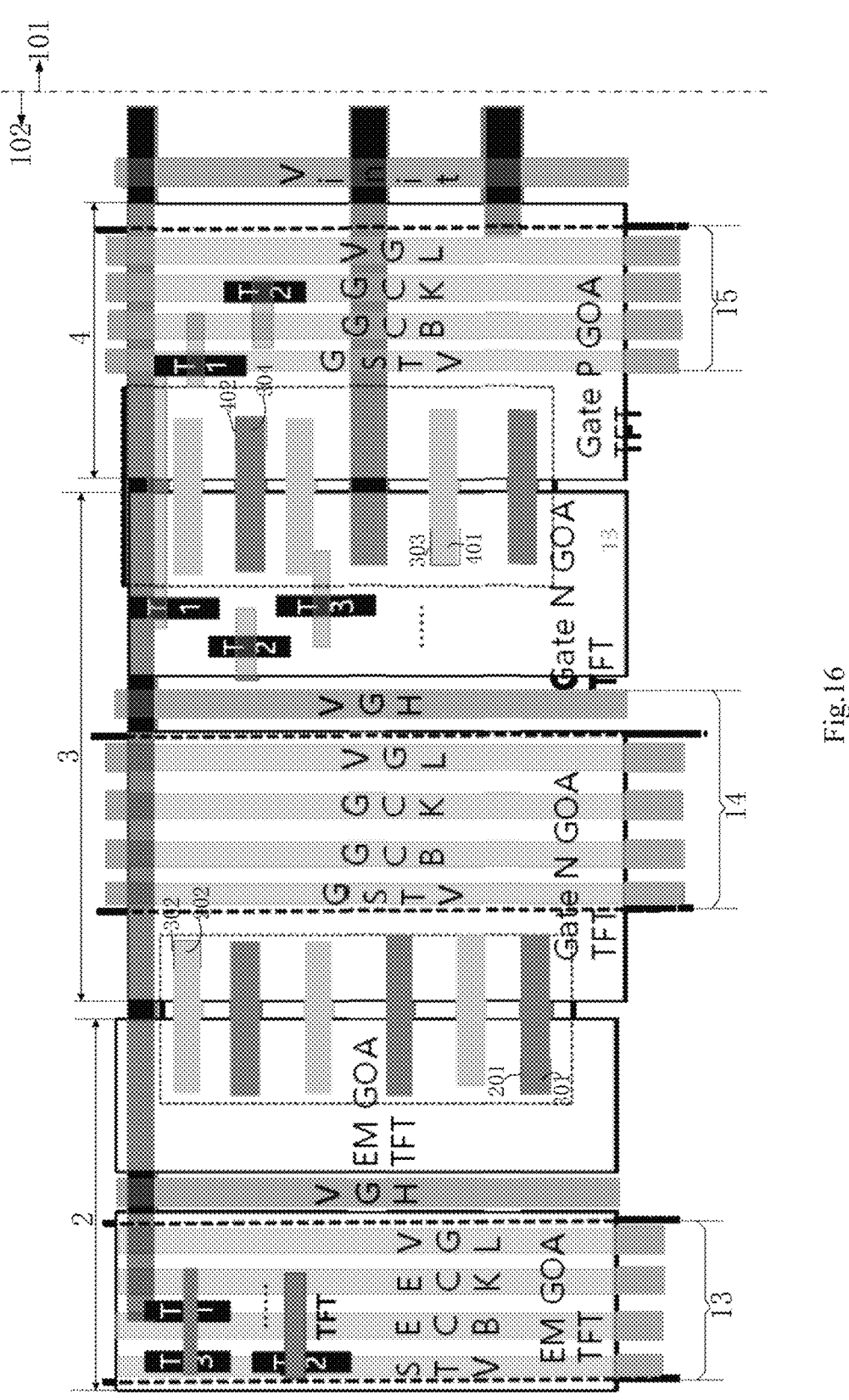
FIG. 16 is a schematic diagram of an arrangement of gate driving circuits in a border area of a display substrate in an embodiment of the present disclosure.

FIG. 16 is a schematic diagram of an arrangement of gate driving circuits in a border area of a display substrate in an embodiment of the present disclosure, referring to FIG. 16, in some implementations, the display substrate further includes: a first group of signal lines 13 connected to the first gate driving circuit 2; a second group of signal lines 14 connected to the second gate driving circuit 3; a third group of signal lines 15 connected to the third gate driving circuit 4; orthographic projection of the first group of signal lines 13 on the base substrate are overlapped with that of the first gate driving circuit 2 on the base substrate; orthographic projections of the second group of signal lines 14 on the base substrate are overlapped with that of the second gate driving circuit 3 on the base substrate; orthographic projections of the third group of signal lines 15 on the base substrate are overlapped with that of the third gate driving circuit 4 on the base substrate.

In some implementations, referring to FIGS. 16 and 12E, the first group of signal lines 13, the second group of signal lines 14, and the third group of signal lines 15 each include a power signal line, a clock signal line, and a trigger signal line. The power signal line includes a first power signal line and a second power signal line; the clock signal lines in the first group of signal lines 13 and the second group of signal lines 14 include a first clock signal line, a second clock signal line, and a third clock signal line. The fourth conductive layer 10 further includes patterns of the second power signal line 108 in the first group of signal lines 13 and the second clock signal line 109 in the second group of signal lines 14.

Figure 12F:
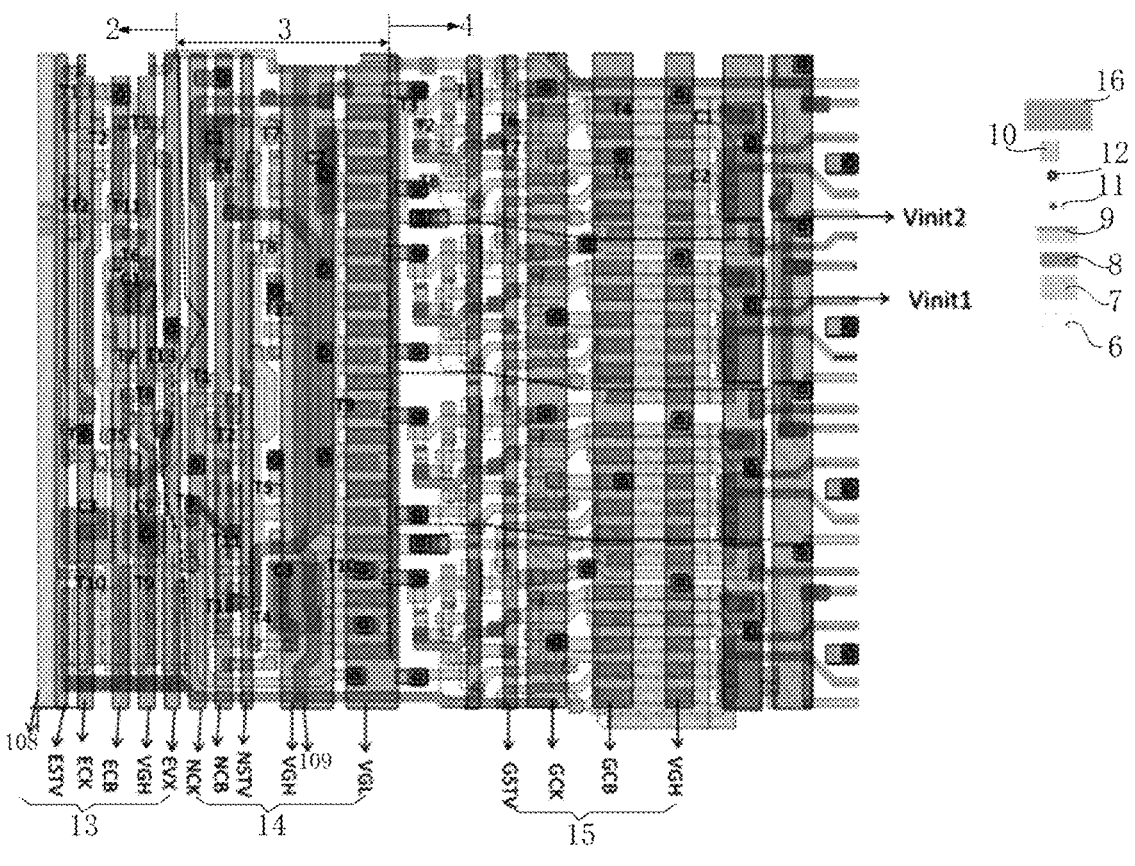
FIG. 12F is a schematic layout diagram showing a fifth conductive layer in a border area of a display substrate in an embodiment of the present disclosure.

FIG. 12F is a schematic layout diagram showing a fifth conductive layer in a border area of a display substrate in an embodiment of the present disclosure, referring to FIG. 12F, in some implementations, the display substrate further includes a fifth conductive layer 16 located on a side of the fourth conductive layer 10 away from the base substrate; the planarization layer includes a first sub-layer, which is located between the fourth conductive layer 10 and the fifth conductive layer 16. The fifth conductive layer 16 further includes patterns of other signal lines of the first group of signal lines 13, the second group of signal lines 14, and the third group of signal lines 15 except for the second power signal line 108 in the first group of signal lines 13 and the second clock signal line 109 in the second group of signal lines 14.

In some implementations, referring to FIG. 12F, the fifth conductive layer 16 includes a trigger signal line ESTV, a first clock signal line ECK, a second clock signal line ECB, a third clock signal line EVX, and a first power signal line VGH of the first group of signal lines 13; the fifth conductive layer 16 further includes a trigger signal line NSTV, a first clock signal line NCK, a third clock signal line NCB, a first power signal line VGH, and a second power signal line VGL in the second group of signal lines 14; the fifth conductive layer 16 further includes a trigger signal line GSTV, a first clock signal line GCK, a second clock signal line GCB, a first power signal line VGH in the third group of signal lines 15, where the third gate driving circuit 4 and the second gate driving circuit 3 share the second power signal line VGL.

In some implementations, referring to FIG. 12F, the pixel driving circuit is connected to a first reset power line Vinit1 and a second reset power line Vinit 2; the fifth conductive layer 16 further includes patterns of the first reset power line Vinit1 and the second reset power line Vinit 2; orthographic projections of the first reset power line Vinit1 and the second reset power line Vinit 2 on the base substrate are overlapped with that of the third gate driving circuit 4 on the base substrate; the orthographic projection of the first reset power line Vinit1 on the base substrate covers a capacitor C1 and a capacitor C2 in the third gate driving circuit 4. With such arrangement, provision of the first reset power line Vinit1 and the second reset power line Vinit 2 does not additionally occupy a space of the border area of the display substrate any more, thus the bezel of the display substrate can be further narrowed, and a narrow bezel of the display substrate can be realized.

In some implementations, the display substrate further includes a sixth conductive layer (not shown) on a side of the fifth conductive layer away from the base substrate; the planarization layer further includes patterns of a second sub-layer, and the second sub-layer is located between the fifth conductive layer and the sixth conductive layer. The sixth conductive layer includes a first group of signal lines, a second group of signal lines, a third group of signal lines, a first reset power line and a second reset power line. An orthographic projection of each signal line of the sixth conductive layer is overlapped with the orthographic projection of the same signal line in the fifth conductive layer or the fourth conductive layer on the base substrate, and each signal line of the sixth conductive layer is connected with the same signal line in the fifth conductive layer or the fourth conductive layer through a via hole formed in the second sub-layer. With such arrangement, the respective signal lines in the two conductive layers are connected in paralle, which is equivalent to increasing the cross-sectional area of each signal line, therefore the wiring of each signal line is saved, and the signal attenuation on each signal line can be reduced, the power consumption of the display substrate for display can be decreased, and the display effect of the display substrate can be improved.

In the embodiment of the present disclosure, referring to the display substrate in FIG. 16, the width of the spaces occupied by the gate driving circuits in the left and right border areas 102 of the display substrate may be decreased to be extremely narrow, for example, the width of the space occupied by all the gate driving circuits may be reduced from 600 μm to about 300 μm. Compared to the width of the space occupied by the gate driving circuits shown in FIG. 4 in the related art, the width of the space occupied by the gate driving circuits in FIG. 16 in the embodiment of the present disclosure can be reduced by about 50%. Therefore, the border area 102 of the display substrate in the embodiment of the present disclosure shown in FIG. 16 is suitable for the display product requiring an extremely narrow bezel (e.g., the width of the border area is less than 0.7 mm).

In some implementations, referring to FIG. 10, the display substrate further includes: a first group of signal lines 13 connected to the first gate driving circuit 2; a second group of signal lines 14 connected to the second gate driving circuit 3; a third group of signal lines 15 connected to the third gate driving circuit 4, where the first group of signal lines 13 are arranged on a side of the first gate driving circuit 2 away from the display area 101; the second group of signal lines 14 and the third group of signal lines 15 are arranged on a side of the third gate driving circuit 4 proximal to the display area 101, and orthographic projections of the third group of signal lines 15 on the base substrate are not overlapped with orthographic projections of the second group of signal lines 14 on the base substrate.

In some implementations, referring to FIG. 8, the display substrate further includes: a first group signal line 13 connected to the first gate driving circuit 2; a second group of signal lines 14 connected to the second gate driving circuit 3, where the first group of signal lines 13 are arranged on a side of the first gate driving circuit 2 away from the display area 101, and the second group of signal lines 14 are arranged in a region between the second gate driving circuit 3 and the third gate driving circuit 4.

In some implementations, referring to FIG. 8, the display substrate further includes: a third group of signal lines 15 connected to the third gate driving circuit 4, where the third group of signal lines 15 are arranged in a region between the second gate driving circuit 3 and the third gate driving circuit 4, and orthographic projections of the third group of signal lines 15 on the base substrate are not overlapped with orthographic projections of the second group of signal lines 14 on the base substrate.

In some implementations, the third group of signal lines are arranged on a side of the third gate driving circuit (not shown) close to the display area.

In some implementations, the pixel driving circuit includes: a first reset sub-circuit, a threshold compensation sub-circuit, a driving sub-circuit, a data writing sub-circuit, a first light-emitting control sub-circuit, a second light-emitting control sub-circuit, a second reset sub-circuit and a storage sub-circuit. The first reset sub-circuit is respectively connected with a control terminal of the driving sub-circuit and the second gate driving circuit and is configured to reset the control terminal of the driving sub-circuit under the control of a first reset signal and a scanning signal output by the second gate driving circuit. The threshold compensation sub-circuit is respectively connected with the control termi-
nal and a second terminal of the driving sub-circuit and the
second gate driving circuit and is configured to compensate
a threshold of the driving sub-circuit under the control of the
scanning signal output by the second gate driving circuit.
The data writing sub-circuit is respectively connected with
a first terminal of the driving sub-circuit and the third gate
driving circuit, and is configured to write a data signal into
the storage sub-circuit under the control of a scanning signal
output by the third gate driving circuit. The storage sub-
circuit is electrically connected with the control terminal of
the driving sub-circuit and a first power voltage line, respec-
tively, and is configured to store the data signal. The first
light-emitting control sub-circuit is respectively connected
with the first power voltage line, the first terminal of the
driving sub-circuit and the first gate driving circuit, and is
configured to realize connection or disconnection between
the driving sub-circuit and the first power voltage line under
the control of a light-emitting control signal output by the
first gate driving circuit. The second light-emitting control
sub-circuit is respectively connected with the second termi-
nal of the driving sub-circuit, a first electrode of a light-
emitting element and the first gate driving circuit, and is
configured to realize connection or disconnection between
the driving sub-circuit and the light-emitting element under
the control of the light-emitting control signal output by the
first gate driving circuit. The second reset sub-circuit is
respectively connected with the first electrode of the light-
emitting element and the third gate driving circuit, and is
configured to reset the control terminal of the driving
sub-circuit and the first electrode of the light-emitting ele-
ment under the control of a second reset signal and the
scanning signal output by the third gate driving circuit. The
first reset sub-circuit, the threshold compensation sub-cir-
cuit, the driving sub-circuit, the data writing sub-circuit, the
first light-emitting control sub-circuit, the second light-
emitting control sub-circuit and the second reset sub-circuit
each include at least one transistor, the transistor in each of
the first reset sub-circuit and the threshold compensation
sub-circuit adopts a metal oxide transistor; the transistor in
each of the driving sub-circuit, the data writing sub-circuit,
the first light-emitting control sub-circuit, the second light-
emitting control sub-circuit and the second reset sub-circuit
adopts a low-temperature polysilicon transistor.

The pixel driving circuit includes N-type transistors made
of metal oxide and a P-type transistors made of low-
temperature polycrystalline silicon; the display substrate has
the advantages of strong driving capability of the low-
temperature polysilicon transistor, small leakage current and
low power consumption of the metal oxide transistor, and
the like, thereby greatly reducing the power consumption of
the display substrate and realizing the advantages of high
dynamic performance, low refresh rate and the like.

Figure 17:
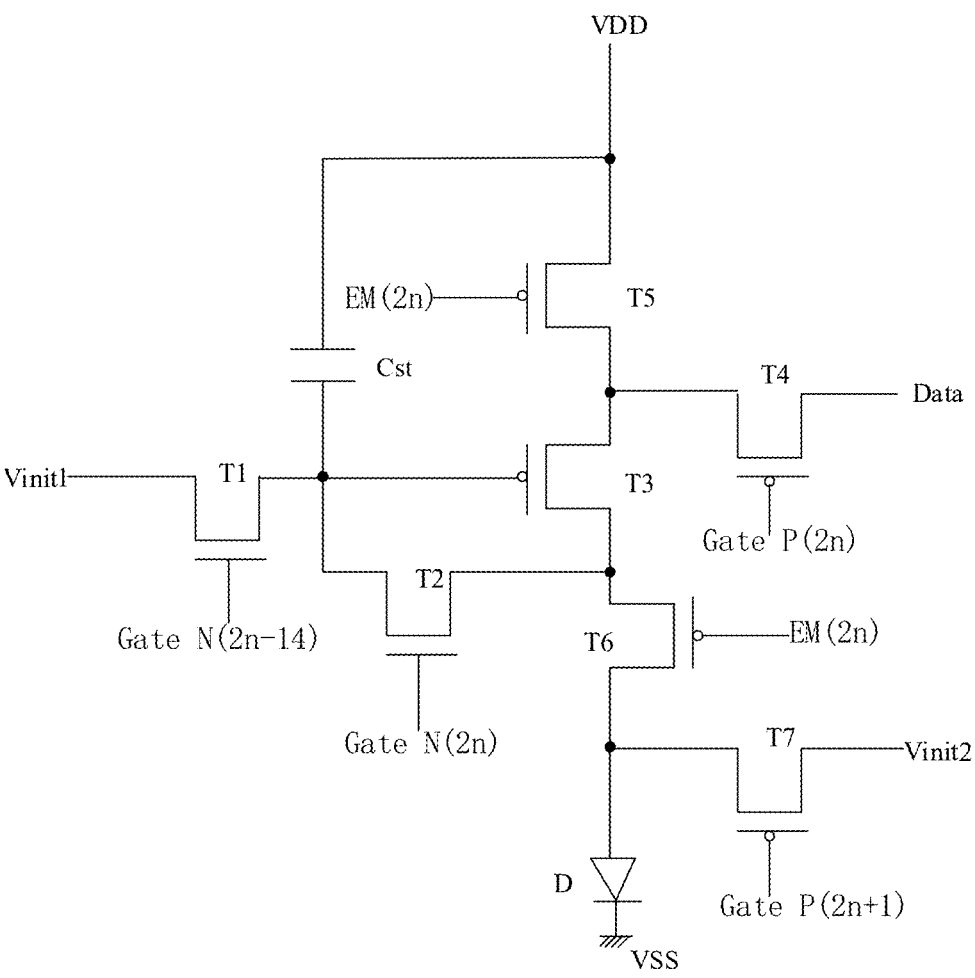
FIG. 17 is a circuit diagram of a pixel driving circuit in an embodiment of the present disclosure.

FIG. 17 is a circuit diagram of a pixel driving circuit in an
embodiment of the present disclosure, referring to FIG. 17,
in some implementations, the first reset sub-circuit includes
a first reset transistor T1, the threshold compensation sub-
circuit includes a threshold compensation transistor T2, the
driving sub-circuit includes a driving transistor T3, the
control terminal of the driving sub-circuit includes a control
electrode of the driving transistor T3, the first terminal of the
driving sub-circuit includes a first electrode of the driving
transistor T3, and the second terminal of the driving sub-
circuit includes a second electrode of the driving transistor
T3. The data writing sub-circuit includes a data writing
transistor T4. The storage sub-circuit includes a storage
capacitor Cst. The first light-emitting control sub-circuit includes a first light-emitting control transistor T5. The
second light-emitting control sub-circuit includes a second
light-emitting control transistor T6. The second reset sub-
circuit includes a second reset transistor T7.

In the present embodiment, the first reset transistor T1 and
the threshold compensation transistor T2 are N-type tran-
sistors; the second gate driving circuit is connected to gates
of the first reset transistor T1 and the threshold compensa-
tion transistor T2, respectively, and the first reset transistor
T1 and the threshold compensation transistor T2 are con-
figured to be turned on or off by a gate driving signal output
from the second gate driving circuit. The first light-emitting
control transistor T5 and the second light-emitting control
transistor T6 are P-type transistors; the first gate driving
circuit is connected to gates of the first light-emitting control
transistor T5 and the second light-emitting control transistor
T6, respectively, and the first light-emitting control transis-
tor T5 and the second light-emitting control transistor T6 are
configured to be turned on or off by a gate driving signal
output from the first gate driving circuit. The driving tran-
sistor T3, the data writing transistor T4, and the second reset
transistor T7 are P-type transistors; the third gate driving
circuit is connected to gates of the data writing transistor T4
and the second reset transistor T7, respectively, and the data
writing transistor T4 and the second reset transistor T7 are
configured to be turned on or off by a gate driving signal
output from the third gate driving circuit.

It should be noted that, in the embodiment of the present
disclosure, in addition to be of the 7T1C (i.e., seven tran-
sistors and one capacitor) structure shown in FIG. 17, the
pixel driving circuit may also be of a circuit structure
including another number of transistors and capacitors, such
as a 7T2C structure, a 6T1C structure, a 6T2C structure, or
a 9T2C structure, which is not limited in the embodiment of
the present disclosure.

In some implementations, the first reset transistor T1 and
the threshold compensation transistor T2 are bottom gate
type transistors; the driving transistor T3, the data writing
transistor T4, the first light-emitting control transistor T5,
the second light-emitting control transistor T6, and the
second reset transistor T7 are top gate type transistors.

In some implementations, the first reset transistor T1, the
threshold compensation transistor T2, the driving transistor
T3, the data writing transistor T4, the first light-emitting
control transistor T5, the second light-emitting control tran-
sistor T6, and the second reset transistor T7 are not particu-
larly limited to top gate type transistors or bottom gate type
transistors, and each transistor may be a top gate type
transistor or a bottom gate type transistor.

Figure 18:
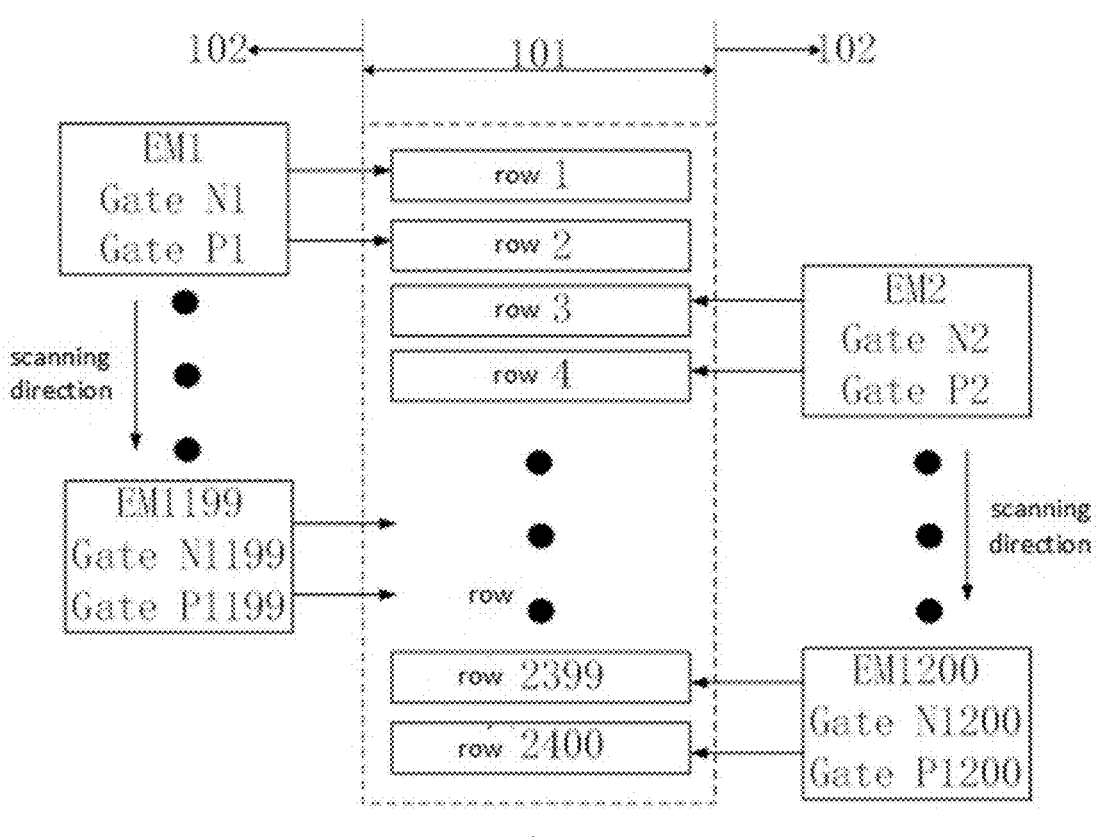
FIG. 18 is a schematic diagram showing a principle that a display substrate is driven in such a way that each shift register of a gate driving circuit drives two rows of pixel driving circuits from a single side of the pixel driving circuits in an embodiment of the present disclosure.

FIG. 18 is a schematic diagram showing a principle that
a display substrate is driven by adopting a gate driving
circuit in which each shift register drives two rows of pixel
driving circuits from a single side of the pixel driving
circuits in an embodiment of the present disclosure, referring
to FIG. 18, in some implementations, a plurality of pixel
driving circuits are arranged in an array, where the first gate
driving circuit includes a plurality of first shift registers EM
which are sequentially cascaded, the second gate driving
circuit includes a plurality of second shift registers Gate N
which are sequentially cascaded, the third gate driving
circuit includes a plurality of third shift registers Gate P
which are sequentially cascaded. Each first shift register EM
is correspondingly connected with two rows of pixel driving
circuits, each second shift register Gate N is correspondingly
connected with four rows of pixel driving circuits, and each
third shift register Gate P is correspondingly connected to
two rows of pixel driving circuits.

In some implementations, referring to FIG. 17, each first shift register EM is correspondingly connected to two adjacent rows of pixel driving circuits, that is, an output terminal of each first shift register EM is connected to the gates of the first light-emitting control transistor T5 and the second light-emitting control transistor T6 of each of pixel driving circuits in two adjacent rows. An output terminal of each second shift register Gate N is correspondingly connected with the pixel driving circuits in a $(2n)^{th}$ row, a $(2n+1)^{th}$ row, a $(2n-14)^{th}$ row and a $(2n-13)^{th}$ row, that is, the output terminal of each second shift register Gate N is connected with a gate of the threshold compensation transistor T2 of each of the pixel driving circuits in the $(2n)^{th}$ row and the $(2n+1)^{th}$ row, and is connected with the gate of the first reset transistor T1 of each of the pixel driving circuits in the $(2n-14)^{th}$ row and the $(2n-13)^{th}$ row. Each third shift register Gate P is correspondingly connected with the pixel driving circuits in two adjacent rows, that is, an output terminal of each third shift register Gate P is correspondingly connected with a gate of the data writing transistor T4 of each of the pixel driving circuits in the $(2n)^{th}$ row, and is connected with a gate of the second reset transistor T7 of each of the pixel driving circuits in the $(2n+1)^{th}$ row.

In some implementations, referring to FIG. 18, the $(2n-1)^{th}$ first shift registers EM(2n−1) and the $2n^{th}$ first shift registers EM(2n) are respectively arranged in two border areas 102 on opposite sides at the periphery of the display area 101; the $(2n-1)^{th}$ first shift registers EM(2n−1) are sequentially arranged along a column direction in which the pixel driving circuits are arranged, the $(2n)^{th}$ first shift registers EM(2n) are sequentially arranged along the column direction in which the pixel driving circuits are arranged, the $(2n-1)^{th}$ second shift registers Gate N(2n−1) and the $(2n)^{th}$ second shift registers Gate N(2n) are respectively arranged in two border areas 102 on opposite side at the periphery of the display area 101; the $(2n-1)^{th}$ second shift registers Gate N(2n−1) are sequentially arranged along the column direction in which the pixel driving circuits are arranged; the $(2n)^{th}$ second shift registers Gate N(2n) are sequentially arranged along the column direction in which the pixel driving circuits are arranged; the $(2n-1)^{th}$ third shift registers Gate P(2n−1) and the $(2n)^{th}$ third shift registers Gate P(2n) are respectively arranged in two border areas 102 on opposite sides at the periphery of the display area 101; the $(2n-1)^{th}$ third shift registers Gate P(2n−1) are sequentially arranged along the column direction in which the pixel driving circuits are arranged; the $(2n)^{th}$ third shift registers Gate P (2n) are sequentially arranged along the column direction in which the pixel driving circuits are arranged, where n is not less than 1 and is an integer.

Figure 19:
FIG. 19 is a schematic diagram showing a principle that a display substrate is driven in such a way that each shift register of a gate driving circuit drives two rows of pixel driving circuits from two sides of the pixel driving circuits in an embodiment of the present disclosure.
Figure 19:
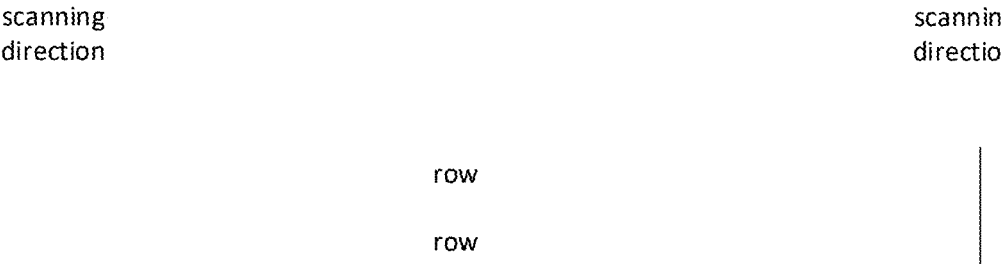

FIG. 19 is a schematic diagram showing a principle that a display substrate is driven by adopting a gate driving circuit in which each shift register drives two rows of pixel driving circuits from two sides of the pixel driving circuits in an embodiment of the present disclosure, referring to FIG. 19, in some implementations, the $(2n-1)^{th}$ first shift registers EM(2n−1) in the first gate driving circuit are symmetrically distributed in the left and right border areas 102 of the display substrate, and the two symmetrically distributed $(2n-1)^{th}$ first shift registers EM(2n−1) respectively drive the same two rows of pixel driving circuits from the left and right sides; the $(2n)^{th}$ first shift registers EM(2n) are symmetrically distributed in the left and right border areas 102 of the display substrate; and the two $(2n)^{th}$ first shift registers EM(2n), which are symmetrically distributed, respectively drive the same two rows of pixel driving circuits from the left and right sides. The $(2n-1)^{th}$ second shift registers Gate N(2n−1) in the second gate driving circuit are symmetrically distributed in the left and right border areas 102 of the display substrate, and the two symmetrically distributed $(2n-1)^{th}$ second shift registers Gate N(2n−1) respectively drive the same two rows of pixel driving circuits from the left and right sides; the $(2n)^{th}$ second shift registers Gate N(2n) are symmetrically distributed in the left and right border areas 102 of the display substrate; and the two symmetrically distributed $(2n)^{th}$ second shift registers Gate N(2n) drive the same two rows of pixel driving circuits from the left and right sides, respectively. The $(2n-1)^{th}$ third shift registers Gate P(2n−1) in the third gate driving circuit are symmetrically distributed in the left and right border areas 102 of the display substrate, and the two symmetrically distributed $(2n-1)^{th}$ third shift registers Gate P(2n−1) respectively drive the same two rows of pixel driving circuit from the left and right sides; the $(2n)^{th}$ third shift registers Gate P(2n) are symmetrically distributed in the left and right border areas 102 of the display substrate; and the two symmetrically distributed $(2n)^{th}$ third shift registers Gate P(2n) drive the same two rows of pixel driving circuits from the left and right sides, respectively. Therefore, the first gate driving circuit, the second gate driving circuit and the third gate driving circuit can drive the display substrate in a way such that each shift register drives two rows of pixel driving circuits from two sides of the pixel driving circuits.

Figure 20:
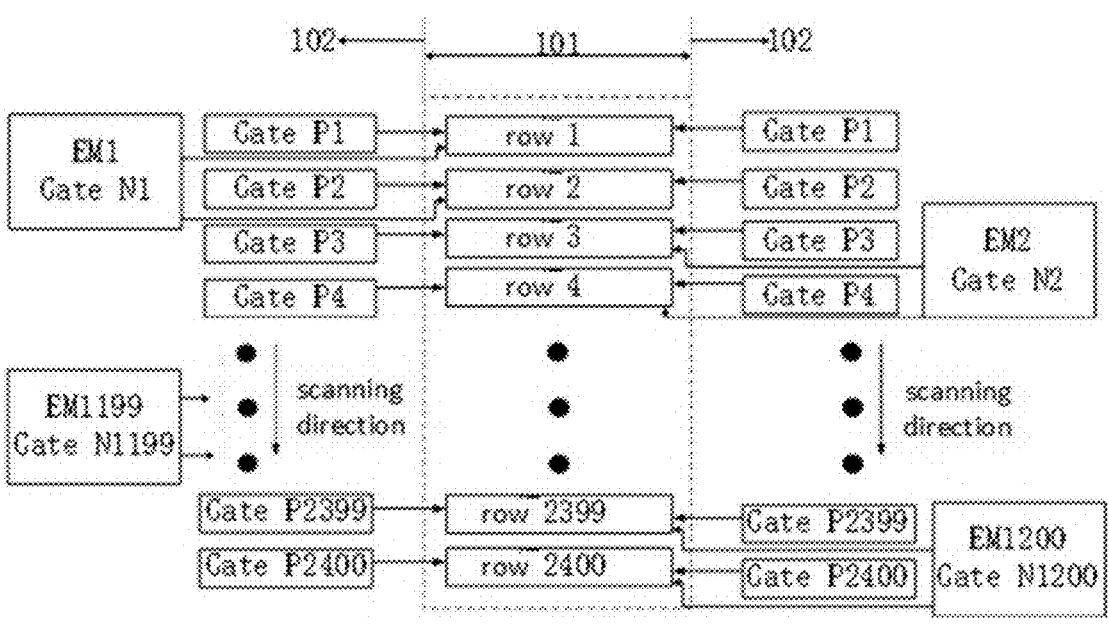
FIG. 20 is a schematic diagram showing a principle that a display substrate is driven in such a way that each shift register of a first gate driving circuit and a second gate driving circuit drives two rows of pixel driving circuits from a single side of the pixel driving circuits and each shift register of a third gate driving circuit drives one row of pixel driving circuits from two sides of the pixel driving circuits in an embodiment of the present disclosure.

FIG. 20 is a schematic diagram showing a principle that a display substrate is driven in such a way that each shift register of each of a first gate driving circuit and a second gate driving circuit drives two rows of pixel driving circuits from a single side of the pixel driving circuits and each shift register of a third gate driving circuit drives one row of pixel driving circuits from two sides of the pixel driving circuits in an embodiment of the present disclosure. Referring to FIG. 20, in some implementations, the $(2n-1)^{th}$ first shift registers EM(2n−1) in the first gate driving circuit are arranged in the left border area 102 of the display substrate, and each $(2n-1)^{th}$ first shift register EM(2n−1) drives two rows of pixel driving circuits from the left side; the $(2n)^{th}$ first shift registers EM (2n) are arranged in the right border area 102 of the display substrate; and each $(2n)^{th}$ first shift register EM(2n) drives two rows of pixel driving circuits from the right side; the two rows of pixel driving circuits driven by each $(2n-1)^{th}$ first shift register EM(2n−1) are different from two rows of pixel driving circuits driven by each $(2n)^{th}$ first shift register EM(2n). The $(2n-1)^{th}$ second shift registers Gate N(2n−1) in the second gate driving circuit are arranged in the left border area 102 of the display substrate, and each $(2n-1)^{th}$ second shift register Gate N(2n−1) drives four rows of pixel driving circuits from the left side; the $(2n)^{th}$ second shift registers Gate N(2n) are arranged in the right border area 102 of the display substrate; and each $(2n)^{th}$ second shift register Gate N(2n) drives four rows of pixel driving circuits from the right side; the four rows of pixel driving circuits driven by each $(2n-1)^{th}$ second shift register Gate N(2n−1) are different from the four rows of pixel driving circuits driven by each $(2n)^{th}$ second shift register Gate N(2n). Therefore, the first gate driving circuit and the second gate driving circuit can drive the display substrate in a way such that each shift register drives two rows of pixel driving circuits from a single side. The $(2n-1)^{th}$ third shift registers Gate P(2n−1) in the third gate driving circuit are symmetrically distributed in the left and right border areas 102 of the display substrate, and the two symmetrically distributed $(2n-1)^{th}$ third shift registers Gate P(2n−1) respectively drive the same row of pixel driving circuits from the left and right sides; the $(2n)^{th}$ third shift registers Gate P(2n) are symmetrically distributed in the left and right border areas 102 of the display substrate; and the two symmetrically distributed $(2n)^{th}$ third shift registers Gate P(2n) drive the same row of pixel driving circuits from the left and right sides, respectively. The row of pixel driving circuits driven by each $(2n-1)^{th}$ third shift register Gate P(2n-1) are different from the row of pixel driving circuits driven by each $(2n)^{th}$ third shift register Gate P(2n). Therefore, the third gate driving circuit can drive the display substrate in a way such that each shift register drives one row of pixel driving circuits from two sides.

Figure 21:
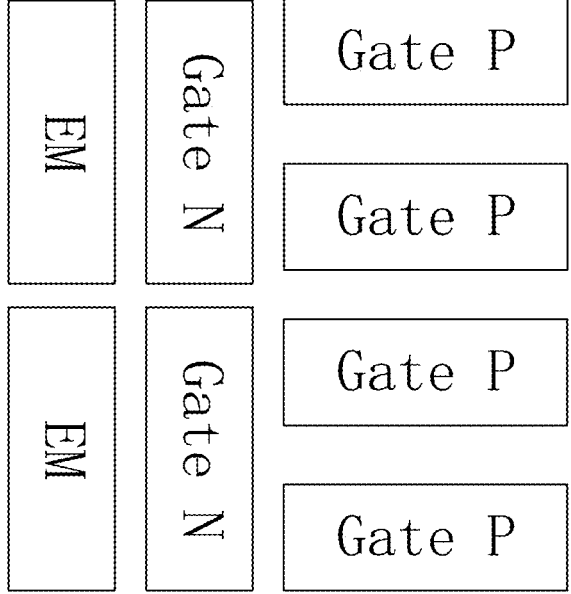
FIG. 21 is a schematic layout diagram of gate driving circuits in a display substrate in the related art where each shift register of each of a first gate driving circuit and a second gate driving circuit drives two rows of pixel driving circuits from two sides of the pixel driving circuits and each shift register of a third gate driving circuit drives one row of pixel driving circuits from two sides of the pixel driving circuits.
Figures 22, 23:
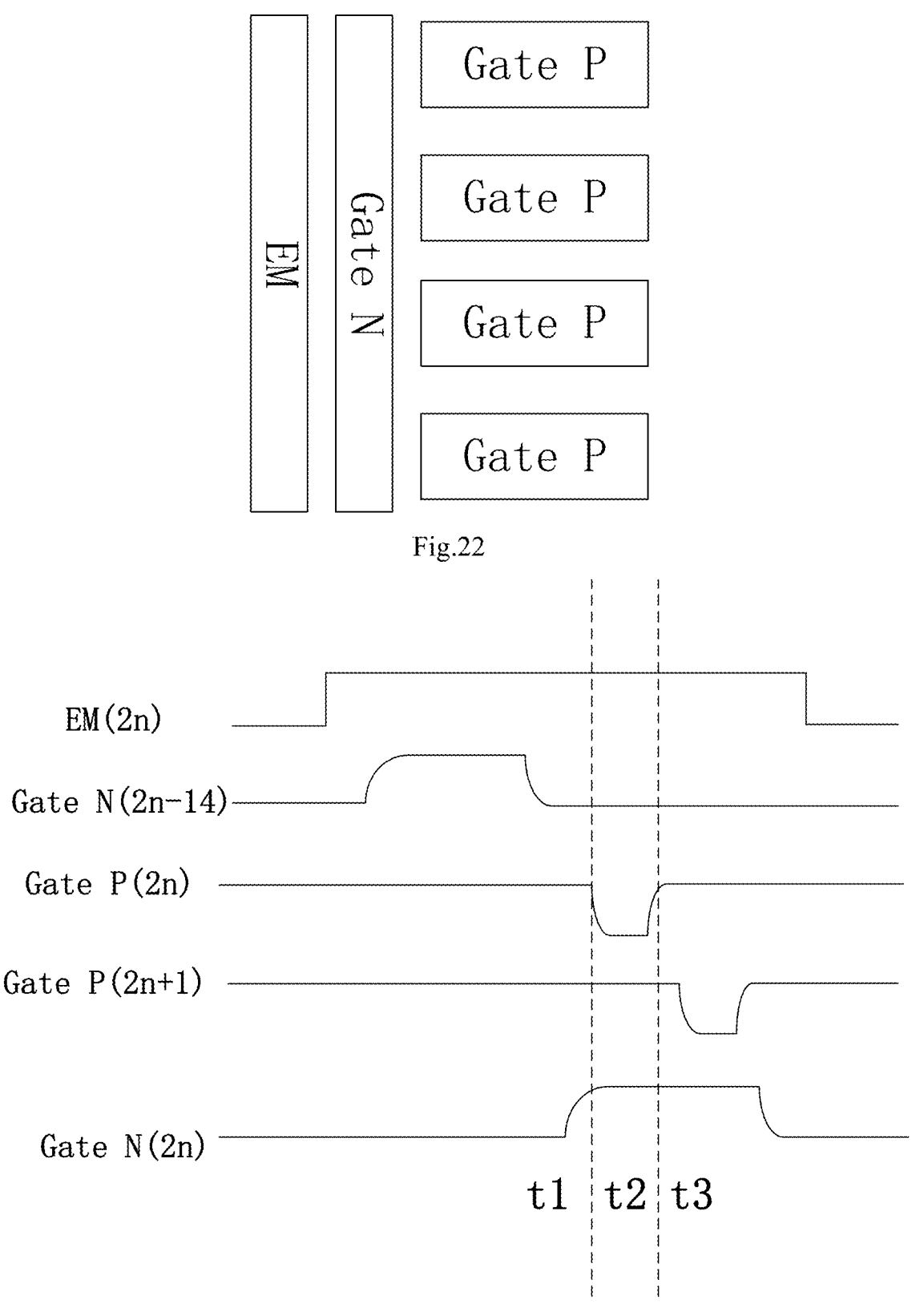
FIG. 22 is a schematic layout diagram of gate driving circuits in a display substrate in an embodiment of the present disclosure where each shift register of each of a first gate driving circuit and a second gate driving circuit drives two rows of pixel driving circuits from a single side of the pixel driving circuits and each shift register of a third gate driving circuit drives one row of pixel driving circuits from two sides of the pixel driving circuits.
FIG. 23 is a timing diagram of an operation of a pixel driving circuit in FIG. 17 in an embodiment of the present disclosure.

FIG. 21 is a schematic layout diagram of gate driving circuits in a display substrate in the related art where each shift register of each of a first gate driving circuit and a second gate driving circuit drives two rows of pixel driving circuits from two sides of the pixel driving circuits and each shift register of a third gate driving circuit drives one row of pixel driving circuits from two sides of the pixel driving circuits, FIG. 22 is a schematic layout diagram of gate driving circuits in a display substrate in an embodiment of the present disclosure where each shift register of each of a first gate driving circuit and a second gate driving circuit drives two rows of pixel driving circuits from a single side of the pixel driving circuits and each shift register of a third gate driving circuit drives one row of pixel driving circuits from two sides of the pixel driving circuits. Referring to FIGS. 21 and 22, in some implementations, the $(2n-1)^{th}$ first shift registers EM(2n-1) in the first gate driving circuit are arranged in the left border area 102 of the display substrate, and each $(2n-1)^{th}$ first shift register EM(2n-1) drives two rows of pixel driving circuits from the left side, the $(2n)^{th}$ first shift registers EM(2n) are arranged in the right border area 102 of the display substrate; and each $(2n)^{th}$ first shift register EM(2n) drives two rows of pixel driving circuits from the right side, the two rows of pixel driving circuits driven by each $(2n-1)^{th}$ first shift register EM(2n-1) are different from the two rows of pixel driving circuits driven by each $(2n)^{th}$ first shift register EM(2n). The $(2n-1)^{th}$ second shift registers Gate N(2n-1) in the second gate driving circuit are arranged in the left border area 102 of the display substrate, and each $(2n-1)^{th}$ second shift register Gate N(2n-1) drives four rows of pixel driving circuits from the left side; the $(2n)^{th}$ second shift registers Gate N(2n) are arranged in the right border area 102 of the display substrate; and each $(2n)^{th}$ second shift register Gate N(2n) drives four rows of pixel driving circuits from the right side; the four rows of pixel driving circuits driven by each $(2n-1)^{th}$ second shift register Gate N(2n-1) are different from the four rows of pixel driving circuits driven by each $(2n)^{th}$ second shift register Gate N(2n). Therefore, the first gate driving circuit and the second gate driving circuit can drive the display substrate in such a way that each shift register drives two rows of pixel driving circuits. The $(2n-1)^{th}$ third shift registers Gate P(2n-1) in the third gate driving circuit are symmetrically distributed in the left and right border areas 102 of the display substrate, and the two symmetrically distributed $(2n-1)^{th}$ third shift registers Gate P(2n-1) respectively drive a same row of pixel driving circuits from the left and right sides; the $(2n)^{th}$ third shift registers Gate P(2n) are symmetrically distributed in the left and right border areas 102 of the display substrate; and two symmetrically distributed $(2n)^{th}$ third shift registers Gate P(2n) drive a same row of pixel driving circuits from the left and right sides, respectively. The row of pixel driving circuits driven by each $(2n-1)^{th}$ third shift register Gate P(2n-1) are different from the row of pixel driving circuits driven by each $(2n)^{th}$ third shift register Gate P(2n). Therefore, the third gate driving circuit can drive the display substrate in such a way that each shift register drives one row of pixel driving circuits from two sides.

In comparison with the arrangement of the gate driving circuits in FIG. 21, the numbers of the first shift registers EM and the second shift registers Gate N in each of the left border area 102 and the right border area 102 of the display substrate in FIG. 22 is relatively decreased, so that the width of the space occupied by the first gate driving circuits and the second gate driving circuits in each of the left border area 102 and the right border area 102 can be reduced, and the narrow bezel of the display substrate can be realized.

In some implementations, referring to FIG. 22, in any one of the left border area 102 and the right border area 102, which are opposite to each other, at the periphery of the display area 101, a region where one first shift register EM is arranged corresponds to a region where one second shift register Gate N is arranged, a region where one first shift register EM is arranged corresponds to a region where four third shift registers Gate P are arranged. Since the number of the first shift registers EM and the second shift registers Gate N arranged in the left and right border areas 102 of the display substrate is significantly reduced compared to the arrangement of the gate driving circuits in FIG. 21, a region where the first shift registers EM and the second shift registers Gate N are arranged in any one of the border areas 102 can be relatively lengthened, so that an area and a space, in a width direction, occupied by the first shift registers EM and the second shift registers Gate N in any one of the border areas 102 can be reduced, the width of each of the left and right border areas 102 of the display substrate can be reduced, and a narrow bezel can be achieved.

In some implementations, referring to FIG. 17, the transistors in the pixel driving circuit with 7T1C structure has the following connection relationship: a drain of the data writing transistor T4 is electrically connected to a source of the driving transistor T3, a source of the data writing transistor T4 is configured to be electrically connected to a data line Data to receive a data signal, and a gate of the data writing transistor T4 is configured to be electrically connected to a second scanning line Gate P(2n) to receive a scanning signal; a second plate of the storage capacitor Cst is electrically connected to a first power voltage line VDD, and a first plate of the storage capacitor Cst is electrically connected to a gate of the driving transistor T3; a source of the threshold compensation transistor T2 is electrically connected to the gate of the driving transistor T3, a drain of the threshold compensation transistor T2 is electrically connected to a drain of the driving transistor T3, and a gate of the threshold compensation transistor T2 is configured to be electrically connected to a first scanning line Gate N(2n) to receive a compensation control signal; a source of the first reset transistor T1 is configured to be electrically connected to the first reset power line Vinit1 to receive a first reset signal, a drain of the first reset transistor T1 is electrically connected to the gate of the driving transistor T3, and a gate of the first reset transistor T1 is configured to be electrically connected to a first reset control line Gate N(2n-14) to receive a first reset control signal; a drain of the second reset transistor T7 is configured to be electrically connected to a second reset power line Vinit2 to receive the first reset signal, a source of the second reset transistor T7 is electrically connected to the first electrode of the light-emitting element D, and a gate of the second reset transistor T7 is configured to be electrically connected to a second reset control line Gate P(2n+1) to receive a second reset control signal; a source of the first light-emitting control transistor T5 is electrically connected to the first power voltage line VDD, a drain of the first light-emitting control transistor T5 is electrically connected to the source of the driving transistor T3, and a gate of the first light-emitting control transistor T5 is configured to be electrically connected to a light-emitting control line EM(2n) to receive a light-emitting control signal; a source of the second light-emitting control transistor T6 is electrically connected to the drain of the driving transistor T3, a drain of the second light-emitting control transistor T6 is electrically connected to the first electrode of the light-emitting element D, and a gate of the second light-emitting control transistor T6 is configured to be electrically connected to the light-emitting control line EM(2n) to receive the light-emitting control signal; a second electrode of the light-emitting element D is electrically connected to a second power source terminal VSS.

For example, one of the first power voltage line VDD and the second power source terminal VSS is a high voltage terminal, and the other is a low voltage terminal. For example, the first power voltage line VDD is a voltage source for outputting a constant first voltage, which is a positive voltage; and the second power source terminal VSS may be a voltage source for outputting a constant second voltage, which is a negative voltage, etc. For example, in some examples, the second power source terminal VSS may be grounded.

In some implementations, the light-emitting element D may be a Micro inorganic Light Emitting Diode, and further, may be an electric current type Light Emitting Diode, such as a Micro Light Emitting Diode (Micro LED) or a Mini Light Emitting Diode (Mini LED), and certainly, the light-emitting element D in the embodiments of the present disclosure may also be an Organic Light Emitting Diode (OLED). One of the first electrode and the second electrode of the light-emitting element D is an anode, and the other is a cathode; in the embodiments of the present disclosure, the first electrode of the light-emitting element D is taken as an anode, and the second electrode of the light-emitting element D is taken as a cathode.

FIG. 23 is a timing diagram of an operation of the pixel driving circuit in FIG. 17 in an embodiment of the present disclosure, referring to FIG. 23, in some implementations, a method for driving the pixel driving circuit may include a reset stage, a data writing and threshold compensation stage and a light emitting stage.

At the reset stage (t1): a high-level signal is written to the first reset control line Gate N(2n−14), a high-level signal is written to the second reset control line Gate P(2n+1), a low-level signal is written to the first scanning line Gate N(2n), a high-level signal is written to the second scanning line Gate P(2n), and a high-level signal is written to the light-emitting control line EM(2n), in such case, the first reset transistor T1 and the second reset transistor T7 are turned on, and the gate of the driving transistor T3 is reset by an initialization voltage written by the first reset power line Vinit1, so as to prepare for the writing of the data voltage Vdata for a next frame. The anode of the light-emitting element D is written with an initialization voltage (the initialization voltage is not more than VSS) through the second reset power line Vinit2 to which the second reset transistor T7 is connected, so that the light-emitting element D is no longer in a forward conduction state, and an internal electric field formed by directional movement of impurity ions in the light-emitting element D is gradually eliminated, thereby recovering the characteristics of the light-emitting element D.

At the data writing and threshold compensation stage (t2): a high-level signal is written to the first scanning line Gate N (2N), a low-level signal is written to the first reset control line Gate N(2n−14), and a high-level signal is written to the light-emitting control line EM(2n), in such case, the data writing transistor T4 and the threshold compensation transistor T2 are turned on, so that the driving transistor T3 forms a diode structure by the threshold compensation transistor T2, and the data voltage Vdata on the data line Data is written to the gate of the driving transistor T3 through the data writing transistor T4 and the threshold compensation transistor T2 until the driving transistor T3 is turned off. A voltage at the gate of the driving transistor T3 is equal to Vdata+Vth (Vth<0, Vth being a threshold voltage of the driving transistor T3), and is stored in the storage capacitor Cst. Voltages at the first plate and the second plate of the storage capacitor Cst are Vdata+Vth and Vd, respectively.

At the light-emitting stage (t3): a low-level signal is written to the light-emitting control line EM(2n), a low-level signal is written to the first scanning line Gate N(2n) and the first reset control line Gate N(2n−14) respectively, in such case, the first light-emitting control transistor T5 and the second light-emitting control transistor T6 are both turned on, the source of the driving transistor T3 is connected to the first power voltage line VDD, and the voltage at the source of the driving transistor T3 is instantaneously changed from Vdata in the previous stage to Vdd. The light-emitting device D emits light under the driving of the driving transistor T3, and at this time, the driving transistor T3 operates in a saturation region, the voltage at the gate of the driving transistor T3 is equal to Vdata+Vth, and the voltage at the source of the driving transistor T3 is equal to Vdd, so a voltage across the gate and the source of the driving transistor T3 is represented as: Vgs=(Vdata+Vth)−Vdd, which is maintained until the reset stage of the next frame.

A light-emitting current of the light-emitting element D is equal to a current flowing through the driving transistor T3, which is expressed as follows:

$$I_D = \beta(Vgs - Vth)^2 \qquad (1)$$
$$= \beta(Vdata + Vth - Vdd - Vth)^2$$
$$= \beta(Vdata - Vdd)^2$$
$$\text{where, } \beta = \frac{1}{2}\mu_n C_{ox}\left(\frac{W}{L}\right),$$

$\mu_n$ is an electron mobility of the driving transistor T3, $C_{ox}$ is an insulation capacitance per unit area, and $$\frac{W}{L}$$

is a width-to-length ratio of the driving transistor T3.

In the display substrate provided in the embodiments of the present disclosure, no gap is provided between adjacent boundary areas of the first gate driving circuit 2, the second gate driving circuit 3 and the third gate driving circuit 4, and the planarization layer 5 is not broken between any two adjacent boundary areas of the first gate driving circuit 2, the second gate driving circuit 3 and the third gate driving circuit 4, but is formed as an entire surface, in this way, the gap between any two adjacent ones of the first gate driving circuit 2, the second gate driving circuit 3 and the third gate driving circuit 4 is cancelled, so that at least part of circuits in adjacent boundary areas of the first gate driving circuit, the second gate driving circuit and the third gate driving circuit are mutually inserted into the space regions where the first gate driving circuit, the second gate driving circuit and the third gate driving circuit are located, respectively, the mixing use or mutual borrowing of the space between any two adjacent gate driving circuits can be realized, and the width of the border area 102 of the display substrate can be reduced; in addition, the display substrate has the advantages of strong driving capability of a low-temperature polysilicon transistor, small leakage current and low power consumption and the like of a metal oxide transistor, so that the power consumption of the display substrate can be greatly reduced, and the advantages of high dynamic performance, low refresh rate and the like can be realized.

In a second aspect, an embodiment of the present disclosure further provides a display panel, which includes the display substrate in the foregoing embodiment.

By adopting the display substrate in the foregoing embodiment, the display panel not only has the advantages of low power consumption, high dynamic performance, low refresh rate and the like, but also achieve a narrow bezel.

In a third aspect, an embodiment of the present disclosure further provides a display device, which includes the display panel in the foregoing embodiment.

By adopting the display panel in the embodiment, the display device not only has the advantages of low power consumption, high dynamic performance, low refresh rate and the like, but also achieve a narrow bezel.

The display device may be any product or component with a display function, such as an OLED panel, an OLED television, a mobile phone, a tablet computer, a notebook computer, a display, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various improvements and modifications can be made therein without departing from the spirit and scope of the present disclosure, and these improvements and modifications are to be considered within the scope of the present disclosure.

What is claimed is:

1. A display substrate, comprising:
a base substrate;
a plurality of light-emitting elements located in a display area;
a plurality of pixel driving circuits located on the base substrate, where the light-emitting elements are located on a side of the pixel driving circuits away from the base substrate, the pixel driving circuits are respectively connected to the light-emitting elements correspondingly, and each of the pixel driving circuits comprises an N-type transistor and a P-type transistor;
a first gate driving circuit, a second gate driving circuit and a third gate driving circuit each located on the base substrate and at least arranged in a border area at a periphery of the display area, wherein the first gate driving circuit and the third gate driving circuit are connected with the P-type transistor in each of the pixel driving circuits, the second gate driving circuit is connected to the N-type transistor in each of the pixel driving circuits; the third gate driving circuit, the second gate driving circuit and the first gate driving circuit are sequentially arranged along a direction away from the display area, and orthographic projections of the third gate driving circuit, the second gate driving circuit and the first gate driving circuit on the base substrate are not overlapped with each other; and
a planarization layer located between the pixel driving circuits and the light-emitting elements and extending to be of an entire surface structure to cover the first gate driving circuit, the second gate driving circuit and the third gate driving circuit.

2. The display substrate of claim 1, further comprising: a third group of signal lines connected to the third gate driving circuit, wherein orthographic projections of the third group of signal lines on the base substrate are overlapped with the orthographic projection of the third gate driving circuit on the base substrate.

3. The display substrate of claim 2, further comprising:
a first group of signal lines connected to the first gate driving circuit;
a second group of signal lines connected to the second gate driving circuit, wherein
orthographic projections of the first group of signal lines on the base substrate are overlapped with the orthographic projection of the first gate driving circuit on the base substrate; and
orthographic projections of the second group of signal lines on the base substrate are overlapped with the orthographic projection of the second gate driving circuit on the base substrate.

4. The display substrate of claim 3, wherein the first group of signal lines, the second group of signal lines, and the third group of signal lines each comprise a power signal line, a clock signal line, and a trigger signal line.

5. The display substrate of claim 4, wherein the third gate driving circuit and the second gate driving circuit share the power signal line.

6. The display substrate of claim 4, wherein the power signal line comprises a first power signal line and a second power signal line,
clock signal lines in the first group of signal lines and the second group of signal lines each comprise a first clock signal line, a second clock signal line, and a third clock signal line;
the fourth conductive layer further comprises patterns of the second power signal line in the first group of signal lines and the second clock signal line in the second group of signal lines.

7. The display substrate of claim 6, further comprising a fifth conductive layer located on a side of the fourth conductive layer away from the base substrate;
the planarization layer comprises a first sub-layer located between the fourth conductive layer and the fifth conductive layer;
the fifth conductive layer further comprises patterns of signal lines of the first group of signal lines, the second group of signal lines, and the third group of signal lines except the second power signal line of the first group of signal lines and the second clock signal line of the second group of signal lines, and wherein
each pixel driving circuit is connected to a first reset power line and a second reset power line;
the fifth conductive layer further comprises patterns of the first reset power line and the second reset power line;
orthographic projections of the first reset power line and the second reset power line on the base substrate are overlapped with the orthographic projection of the third gate driving circuit on the base substrate;

the orthographic projection of the first reset power line on the base substrate covers the capacitors in the third gate driving circuit.

8. The display substrate of claim 7, further comprising a sixth conductive layer located on a side of the fifth conductive layer away from the base substrate;

the planarization layer further comprises a second sub-layer located between the fifth conductive layer and the sixth conductive layer;

the sixth conductive layer comprises patterns of the first group of signal lines, the second group of signal lines, the third group of signal lines, the first reset power line, and the second reset power line;

an orthographic projection of each signal line in the sixth conductive layer is overlapped with orthographic projections of a signal line, which is the same as the signal in the sixth conductive layer, in the fifth conductive layer and the fourth conductive layer on the base substrate, and each signal line in the sixth conductive layer is connected to a signal line, which is the same as the signal in the sixth conductive layer, in the fifth conductive layer and the fourth conductive layer through via holes formed in the second sub-layer.

9. The display substrate of claim 3, wherein the first group of signal lines are arranged on a side, away from the display area, of the first gate driving circuit; and the second group of signal lines and the third group of signal lines are arranged on a side, close to the display area, of the third gate driving circuit, and orthographic projections of the third group of signal lines and the second group of signal lines on the base substrate are not overlapped with each other.

10. The display substrate of claim 3, wherein the first group of signal lines are arranged on a side, away from the display area, of the first gate driving circuit;

the second group of signal lines are arranged in a region between the second gate driving circuit and the third gate driving circuit; and the third group of signal lines are arranged in a region between the second gate driving circuit and the third gate driving circuit, and orthographic projections of the third group of signal lines and the second group of signal lines on the base substrate are not overlapped with each other; or, the third group of signal lines are arranged on a side, close to the display area, of the third gate driving circuit.

11. The display substrate of claim 1, wherein adjacent boundary areas of the orthographic projections of the second gate driving circuit and the third gate driving circuit on the base are at least partially nested.

12. The display substrate of claim 11, wherein a part of a boundary area of the first gate driving circuit adjacent to the second gate driving circuit is formed with a first notch portion; a part of a boundary area of the second gate driving circuit, which is close to the first gate driving circuit, extends to a region where the first gate driving circuit is located to form a first protruding portion;

the first protruding portion is correspondingly located in the first notch portion, and a shape of an orthographic projection of the first protruding portion on the base substrate is matched with a shape of an orthographic projection of the first notch portion on the base substrate;

and/or, a part of a boundary area of the second gate driving circuit close to the first gate driving circuit is formed with a second notch portion; a part of a boundary area of the first gate driving circuit close to the second gate driving circuit extends to a region where the second gate driving circuit is located to form a second protruding portion;

the second protruding portion is correspondingly located in the second notch portion, and a shape of an orthographic projection of the second protruding portion on the base substrate is matched with a shape of an orthographic projection of the second notch portion on the base substrate.

13. The display substrate of claim 12, wherein in adjacent boundary areas of the first gate driving circuit and the second gate driving circuit, part of wirings of the first gate driving circuit extend to the region where the second gate driving circuit is located;

and/or, part of wirings of the second gate driving circuit extends to the region where the first gate driving circuit is located.

14. The display substrate of claim 13, wherein a boundary area of the second gate driving circuit close to the third gate driving circuit is partially formed with a third notch portion; a part of a boundary area of the third gate driving circuit close to the second gate driving circuit extends to the region where the second gate driving circuit is located to form a third protruding portion;

the third protruding portion is correspondingly located in the third notch portion, and a shape of an orthographic projection of the third protruding portion on the base substrate is matched with a shape of an orthographic projection of the third notch portion on the base substrate;

and/or, a part of a boundary area of the third gate driving circuit close to the second gate driving circuit is formed with a fourth notch portion; a part of a boundary area of the second gate driving circuit close to the third gate driving circuit extends to a region where the third gate driving circuit is located to form a fourth protruding portion;

the fourth protruding portion is correspondingly located in the fourth notch portion, and a shape of an orthographic projection of the fourth protruding portion on the base substrate is matched with a shape of an orthographic projection of the fourth notch portion on the base substrate.

15. The display substrate of claim 14, wherein in adjacent boundary areas of the second gate driving circuit and the third gate driving circuit, part of wirings of the second gate driving circuit extends to the region where the third gate driving circuit is located;

and/or, part of wirings of the third gate driving circuit extends to the region where the second gate driving circuit is located.

16. The display substrate of claim 15, further comprising: a first semiconductor layer and a first conductive layer sequentially stacked on the base substrate, and a gate insulating layer is arranged between the first semiconductor layer and the first conductive layer, wherein the first gate driving circuit, the second gate driving circuit and the third gate driving circuit each comprise a plurality of transistors and a plurality of capacitors;

the first semiconductor layer comprises patterns of active layers of the transistors;

the first conductive layer comprises patterns of gates of the transistors, first connection lines connected to the gates, first plates of the capacitors and second connection lines connected to the first plates;

the patterns of part of the active layers in the first semiconductor layer are located in the first protruding portion;

the patterns of part of the gates and part of the first connection lines in the first conductive layer are located in the first protruding portion.

17. The display substrate of claim 16, further comprising a second conductive layer located on a side of the first conductive layer away from the base substrate, and a first passivation layer is arranged between the second conductive layer and the first conductive layer;

the second conductive layer comprises patterns of second plates of the capacitors and third connection lines;

the patterns of part of the third connection lines in the second conductive layer are located in the first protruding portion, the second conductive layer further comprises patterns of fourth connection lines; and part of the fourth connection lines extends from the region where the first gate driving circuit is located to the region where the second gate driving circuit is located; and part of the fourth connection lines further extends from the region where the second gate driving circuit is located to the region where the third gate driving circuit is located.

18. The display substrate of claim 17, further comprising a third conductive layer on a side of the second conductive layer away from the base substrate, wherein a second passivation layer is arranged between the third conductive layer and the second conductive layer;

the third conductive layer comprises patterns of fifth connection lines; and part of the fifth connection lines extends from the region where the second gate driving circuit is located to the region where the third gate driving circuit is located.

19. The display substrate of claim 18, further comprising a fourth conductive layer locate on a side of the third conductive layer away from the base substrate, wherein a first intermediate dielectric layer and a second intermediate dielectric layer are arranged between the fourth conductive layer and the third conductive layer, and the first intermediate dielectric layer and the second intermediate dielectric layer are stacked sequentially in a direction away from the third conductive layer;

first layer via holes are formed in the first intermediate dielectric layer and configured to connect conductive patterns in the fourth conductive layer to conductive patterns in the third conductive layer;

second layer via holes are formed in the second intermediate dielectric layer and are configured to connect the conductive patterns in the fourth conductive layer to conductive patterns in the first conductive layer and conductive patterns in the second conductive layer, respectively;

the fourth conductive layer comprises patterns of sources and drains of the transistors and sixth connection lines; the sixth connection lines are configured to be connected to the sources, the drains and the gates;

the patterns of part of the sources, part of the drains and part of the sixth connection lines in the fourth conductive layer are located in the first protruding portion.

20. The display substrate of claim 19, wherein the fourth conductive layer further comprises patterns of seventh connection lines;

part of the seventh connection lines extend from the region where the first gate driving circuit is located to the region where the second gate driving circuit is located; and part of the seventh connection lines extend from the region where the second gate driving circuit is located to the region where the third gate driving circuit is located, and wherein the fourth conductive layer further comprises patterns of eighth connection lines, and part of the eighth connection lines extend from the region where the second gate driving circuit is located to the region where the third gate driving circuit is located.

* * * * *